United States Patent
Yamaguchi et al.

(10) Patent No.: US 11,605,712 B2
(45) Date of Patent: Mar. 14, 2023

(54) FABRICATION PROCESS FLOW OF DIELECTRIC LAYER FOR ISOLATION OF NANO-SHEET DEVICES ON BULK SILICON SUBSTRATE

(71) Applicant: Tokyo Electron Limited, Tokyo (JP)

(72) Inventors: Shimpei Yamaguchi, Tokyo (JP); Atsushi Tsuboi, Tokyo (JP); Atsushi Endo, Nirasaki (JP); Masaru Sugimoto, Hillsboro, OR (US); Hiroshi Yano, Tokyo (JP); Yasushi Kodashima, Nirasaki (JP); Masanobu Igeta, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 4 days.

(21) Appl. No.: 17/329,153

(22) Filed: May 25, 2021

(65) Prior Publication Data

US 2021/0375684 A1    Dec. 2, 2021

Related U.S. Application Data

(60) Provisional application No. 63/030,070, filed on May 26, 2020.

(51) Int. Cl.
*H01L 29/06* (2006.01)
*H01L 21/02* (2006.01)
*H01L 29/66* (2006.01)

(52) U.S. Cl.
CPC ...... *H01L 29/0665* (2013.01); *H01L 21/0259* (2013.01); *H01L 29/0607* (2013.01); *H01L 29/66477* (2013.01)

(58) Field of Classification Search
CPC ........... H01L 29/42392; H01L 29/0673; H01L 21/823412; H01L 29/78696; H01L 29/785
See application file for complete search history.

(56) References Cited

U.S. PATENT DOCUMENTS

2020/0303500 A1*   9/2020   Loubet .................. B82Y 10/00

OTHER PUBLICATIONS

Zhang et al., "Full Bottom Dielectric Isolation to Enable Stacked Nanosheet Transistor for Low Power and High Performance Applications", IEEE, IEDM19-253, 2019, pp. 11.6.1-11.6.4.

* cited by examiner

*Primary Examiner* — Changhyun Yi
(74) *Attorney, Agent, or Firm* — Xsensus LLP

(57) ABSTRACT

A method for manufacturing a semiconductor device includes forming a support on a side surface of a stack that extends from a substrate. The stack includes a second sacrificial film, plural first sacrificial films and plural silicon (Si)-containing films, wherein one first sacrificial film of the plural sacrificial films is stacked upon the second sacrificial film and the plural sacrificial films and the plural Si-containing films are alternately stacked upon one another, and at least a side of the second sacrificial film is not covered by the support, the one first sacrificial film and the substrate. The method further includes removing the second sacrificial film from the stack to form a space between the substrate and the one first sacrificial film and adjacent to the support, and filling the space with a dielectric film.

18 Claims, 22 Drawing Sheets

FABRICATION PROCESS FLOW OF DIELECTRIC LAYER FOR ISOLATION OF NANO-SHEET DEVICES ON BULK SILICON SUBSTRATE

CROSS-REFERENCE TO RELATED APPLICATION

This application claims the benefit of the earlier filing date of U.S. Provisional Application No. 63/030,070, filed May 26, 2020, the contents of which is incorporated by reference in its entirety.

TECHNICAL FIELD

The present disclosure relates to a method and device for manufacturing a semiconductor substrate. More particularly, the disclosure relates to methods and devices for fabrication process flow of a dielectric layer for isolation of nano-sheet devices on a bulk silicon substrate.

BACKGROUND

Semiconductor fabrication methods have improved with the introduction of new technologies, and as a consequence, the size of integrated circuits (ICs, microelectronic circuits, microchips, or simply "chips") fabricated as a single unit, as well as the feature sizes of components on the IC have also reduced. Miniaturized active and passive semiconductor devices, as well as interconnections are fabricated on a semiconductor substrate (e.g., silicon). To form the ICs, the substrate is subjected to numerous processes, such as doping, ion implantation, etching, thin-film deposition of various materials, and photolithographic patterning. Finally, the individual microcircuits are separated by dicing and then individually packaged as ICs.

Particular process steps employed in forming ICs on a substrate include Atomic Layer Deposition (ALD), Chemical Vapor Deposition (CVD), Atomic Layer Etching (ALE) and Physical Vapor Deposition (PVD). In certain conventional processes, an etching condition is changed according to a depth of a formed pattern. For example, in some conventional process, chamber pressure, RF power, flow ratio of the process gases are changed according to the depth of the formed pattern.

However, the reduction in size of semiconductors may lead to complications in the manufacture and performance of semiconductors. For example, a nano-sheet device may control a short-channel-effect by allowing a nano-sheet channel to be surrounded from all directions. However, such a structure may cause formation of a parasitic planar transistor in a region between source and drain electrodes, resulting in current leakage.

SUMMARY

According to an embodiment, a method for manufacturing a semiconductor device includes forming a support on a side surface of a stack that extends from a substrate. The stack includes a second sacrificial film, plural first sacrificial films and plural silicon (Si)-containing films, wherein one first sacrificial film of the plural sacrificial films is stacked upon the second sacrificial film and the plural sacrificial films and the plural Si-containing films are alternately stacked upon one another, and at least a side of the second sacrificial film is not covered by the support, the one first sacrificial film and the substrate. The method further includes removing the second sacrificial film from the stack to form a space between the substrate and the one first sacrificial film and adjacent to the support; and filling the space with a dielectric film.

The foregoing paragraph has been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings.

DETAILED DESCRIPTION OF THE DRAWINGS

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Figure 1:
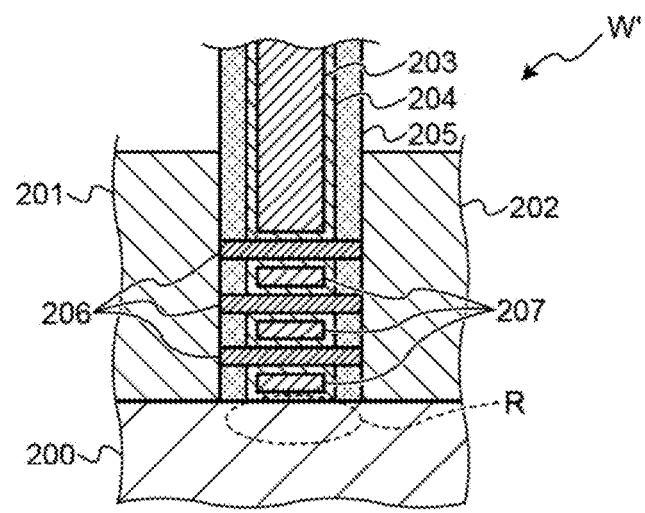
FIG. 1 illustrates a first example of a conventional nano-sheet device structure.

Moving onto discussion of the drawings, the inventors of the present disclosure have recognized limitations in conventional manufacturing technologies as semiconductors continue to reduce in size. For example, as illustrated in FIG. 1, substrate W' includes silicon substrate 200, source and drain electrodes 201 and 202, gate electrode 203, gate dielectric film 204, spacer film 205, nano-sheet channel 206 and gate electrode 207. A nano-sheet device may control short-channel-effect by allowing a nano-sheet channel 206 including nano-sheets to be surrounded from all directions in a cross-section perpendicular to the longitudinal direction of each nano-sheet channel 206. However, such a configuration may cause formation of a parasitic transistor in a region R between source/drain electrodes 201 and 202 at an upper layer of a silicon substrate 200, and this parasitic transistor may be subject to a leakage current in an unintended channel in region R.

Figure 2:
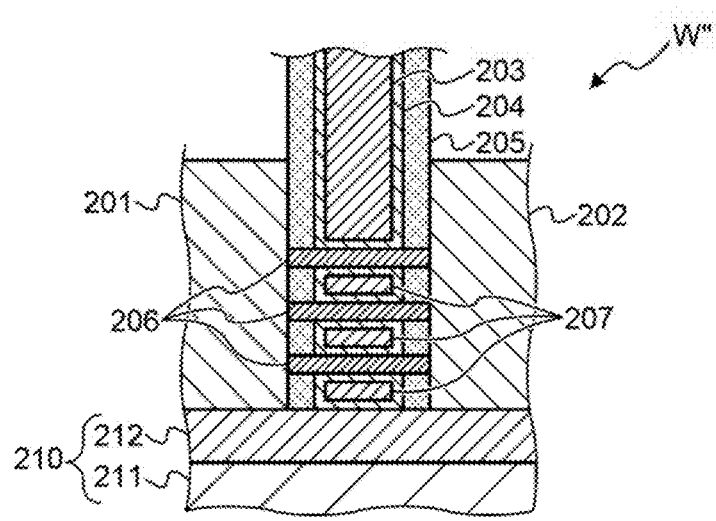
FIG. 2 illustrates a second example of a conventional nano-sheet device structure.

A conventional method to deal with the leakage current is to replace the silicon substrate 200 with a silicon on insulate (SOI) substrate. As illustrated in FIG. 2, substrate W'" includes SOI substrate 210, which includes a silicon layer 211 as well as a dielectric layer 212. The inclusion of a SOI substrate 210 prevents the parasitic transistor from being formed between the source and drain electrodes 201 and 202 and prevents the leakage current. However, SOI substrate 210 is costly and less likely to achieve cost reduction in the nano-sheet device.

The inventors have recognized that relatively less costly bulk silicon substrates are preferable in manufacturing nano-sheet devices with less leakage current. To address the issues with SOI substrates and conventional manufacturing processes, the inventors have developed the systems and methods discussed in this disclosure which replace the SOI substrate(s).

In particular, the inventors have developed a system and method to manufacture a semiconductor device in which a dielectric film is formed under silicon (Si) and Si/germanium (Ge), Si/SiGe, epitaxial layers to avoid formation of a parasitic planar transistor and reduce leakage current. A dielectric film is also formed at the lower part of source/drain epitaxial layers, which allows reduction in the parasitic capacitance between the substrate and the epitaxial layers. Such a structure is produced using bulk substrate and avoiding the use of SOI substrate, resulting in a semiconductor device having less leakage current and providing a performance equivalent to that of a SOI substrate.

FIGS. 3-24 illustrate an exemplary nano-sheet device manufacturing procedure according to a first embodiment of the present disclosure.

Figure 3:
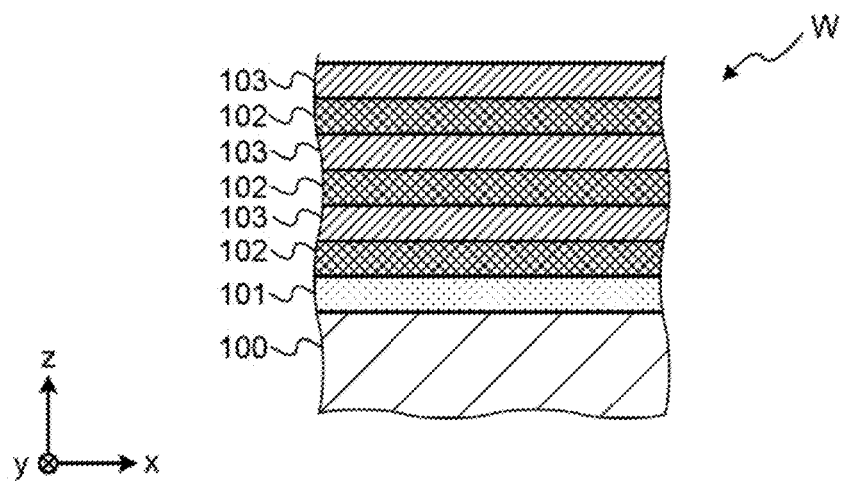
FIG. 3 illustrates an exemplary step of depositing a sacrificial film on a silicon substrate in a nano-sheet device manufacturing procedure according to a first embodiment of the present disclosure.

Turning to FIG. 3, FIG. 3 illustrates an exemplary step of depositing a sacrificial film on a silicon substrate in a nano-sheet device manufacturing procedure according to the first embodiment of the present disclosure. In FIG. 3, an X-Z axis cross section of substrate W is illustrated as viewed along the Y-axis.

Second sacrificial film 101 is deposited upon silicon substrate 101. A first instance of a first sacrificial film 102 is deposited upon second sacrificial film 101, and Si-containing film 103 is deposited on a second instance of the first sacrificial film 102. As illustrated in FIG. 3, other instances of first sacrificial films 102 and Si-containing films 103 are alternately deposited on second sacrificial film 101, one after another.

In an exemplary implementation, second sacrificial film 101 is a SiGe alloy having a content ratio of Ge relative to Si amounts of, for example, 50%-60%. However, second sacrificial film 101 may comprise other compositions ratios of Ge and Si.

The first sacrificial film 102 is a SiGe alloy having a content ratio of Ge relative to Si being less than the content ratio of the SiGe alloy of the second sacrificial film 101. In an exemplary implementation, the first sacrificial film 102 may have a content ratio of Ge relative to Si amounts of, for example, 20%-30%. By having a lower content ratio than the SiGe alloy of the second sacrificial film 101, the Ge-containing Si of first sacrificial film 102 has etch selectivity with respect to the second sacrificial film 101. In other exemplary implementations, second sacrificial film 101 and first sacrificial films 102 may further comprise another Si alloy including a material in addition to or other than Ge such that the content ratios between second sacrificial film 101 and first sacrificial films 102 are different.

The Si-containing films 103 are, for example, monocrystalline Si. In other exemplary implementations, the Si-containing films 103 may be semiconductor films that contain another material composition that is distinguished from second sacrificial film 101 and first sacrificial films 102.

Figure 4:
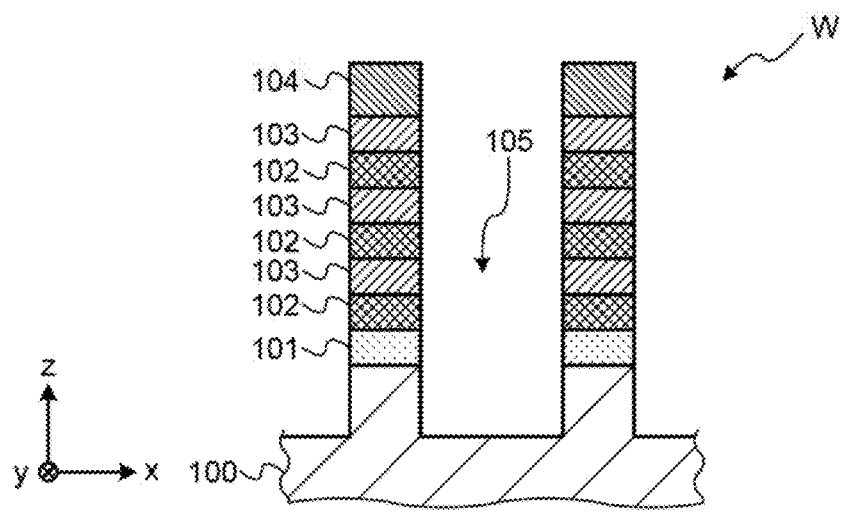
FIG. 4 illustrates an exemplary step of depositing and patterning a hard mask in the nano-sheet device manufacturing procedure according to the first embodiment of the present disclosure.

FIG. 4 illustrates an exemplary step of depositing and patterning a hard mask in the nano-sheet device manufacturing procedure according to the first embodiment of the present disclosure.

As illustrated in FIG. 4, a hard mask 104 is deposited and patterned upon the top layer of Si-containing film 103 of substrate W. In an exemplary implementation, hard mask 104 may be SiN or another hard mask material composition.

After hard mask 104 is deposited and patterned upon the top layer of Si-containing film 103, the nano-sheet device manufacturing procedure proceeds to form trench 105 within substrate W. In an exemplary implementation, trench 105 is formed by performance of anisotropic etching. In particular, the anisotropic etching creates plural rows along the Y-axis of substrate W, each row being a rigid structure that includes the stacked hard mask 104, Si-containing films 103, first sacrificial films 102 and second sacrificial film 101. Each trench 105 is formed between adjacent rows of substrate W. The rigid structure may also be referred to as a stack including second sacrificial film 101, plural first sacrificial films 102 and plural Si-containing films 103. In the anisotropic etching, each trench 105 is formed by removal of hard mask 104, Si-containing films 103, first sacrificial films 102 and second sacrificial film 101. In the exemplary implementation illustrated in FIG. 4, a portion of Si substrate 100 is also removed.

Figure 5:
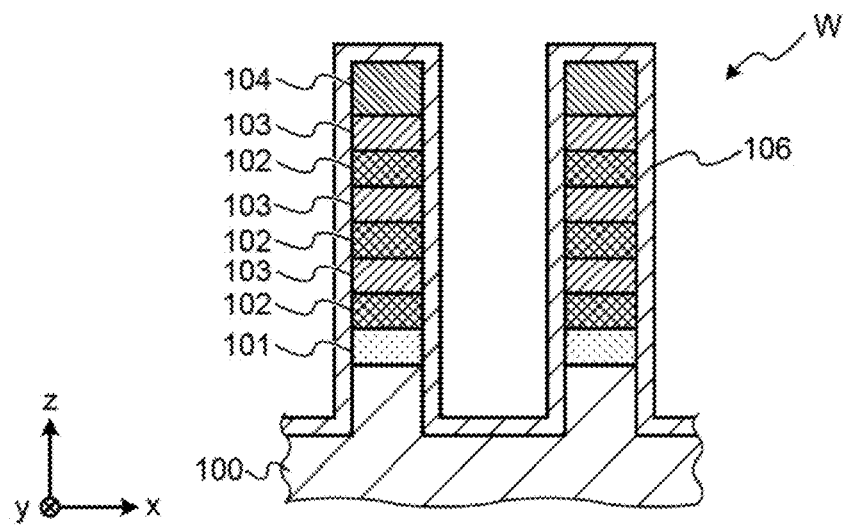
FIG. 5 illustrates an exemplary step of depositing a dielectric film in the nano-sheet device manufacturing procedure according to the first embodiment of the present disclosure.

FIG. 5 illustrates an exemplary step of depositing a dielectric film in the nano-sheet device manufacturing procedure according to the first embodiment of the present disclosure.

As illustrated in FIG. 5, dielectric film 106 is conformally deposited on substrate W. The dielectric film 106 may be conformally deposited by ALD, CVD, or another deposition process. In exemplary implementations, dielectric film 106 may comprise $SiO_2$ or another dielectric material composition. In exemplary implementations, a thickness of the dielectric film 106 may be 5 to 10 nm.

Figure 12:
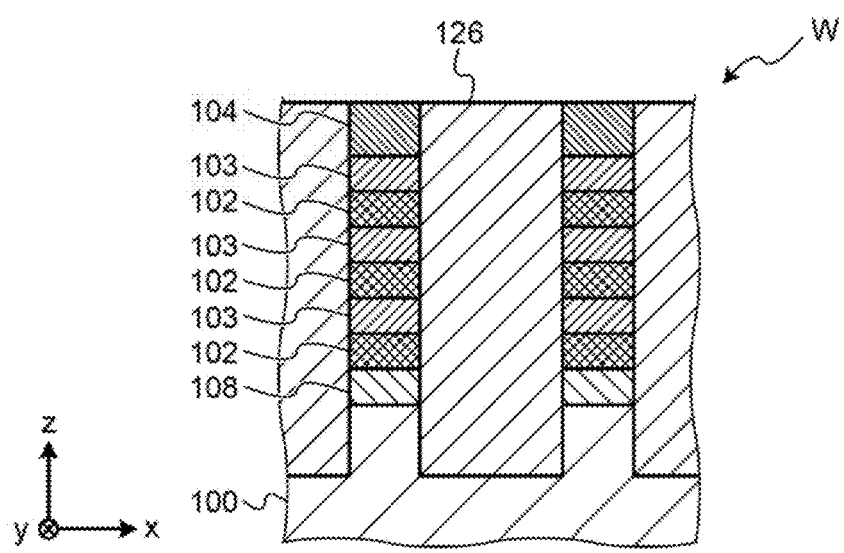
FIG. 12 illustrates an exemplary step of exposing the hard mask in the nano-sheet device manufacturing procedure according to the first embodiment of the present disclosure.

It is noted that dielectric film 106 is deposited onto hard mask 104 and hard mask 104 is not removed prior to deposition of dielectric film 106. This is because hard mask 104 is to be used as a stopper in chemical mechanical polishing (CMP), as illustrated in FIG. 12 and to be described later.

Figure 6:
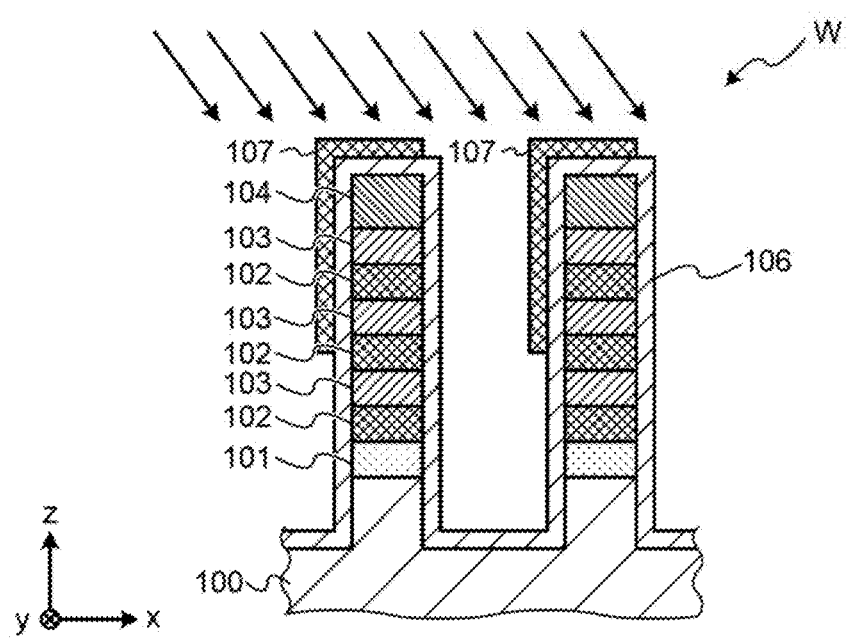
FIG. 6 illustrates an exemplary step of forming a mask in the nano-sheet device manufacturing procedure according to the first embodiment of the present disclosure.

FIG. 6 illustrates an exemplary step of forming a mask in the nano-sheet device manufacturing procedure according to the first embodiment of the present disclosure. As illustrated in FIG. 6, a mask 107 is partially formed upon dielectric film 106 of substrate W. The mask 107 may be partially formed by, for example, PVD or another deposition procedure.

The mask 107 is formed to partially cover a top of each row of substrate W and to partially cover a side of each row of substrate W. As shown in FIG. 6, the mask 107 is formed to cover dielectric film 106 on a same side of each row of substrate W, leaving the other side of each row of substrate W unprotected. With this configuration, the top of each row of substrate W is partially covered, leaving a portion of each top corresponding to other side of each row of substrate W unprotected.

As shown in FIG. 6, the substrate W may be held obliquely with respect to a target and anisotropic deposition is performed to partially form the mask 107. Alternatively, anisotropic deposition may be performed at an oblique angle with respect to substrate W to partially form the mask 107. The deposition is performed at an oblique angle so that the PVD film is asymmetrically deposited as shown in FIG. 6. Moreover, the preferential deposition on the side and top of each row of substrate W is a result of a combination of the height and pitch of adjacent rows and the oblique angle of deposition. This combination gives rise to a shadow effect that allows deposition of the mask 107 on an upper portion of one side and a of each row, but is blocked from being deposited on the bottom portion and the other side of each row.

In an exemplary implementation, mask 107 may include Ti. For example, the mask 107 may be a TiN film, but is not limited to such a material composition.

Figure 7:
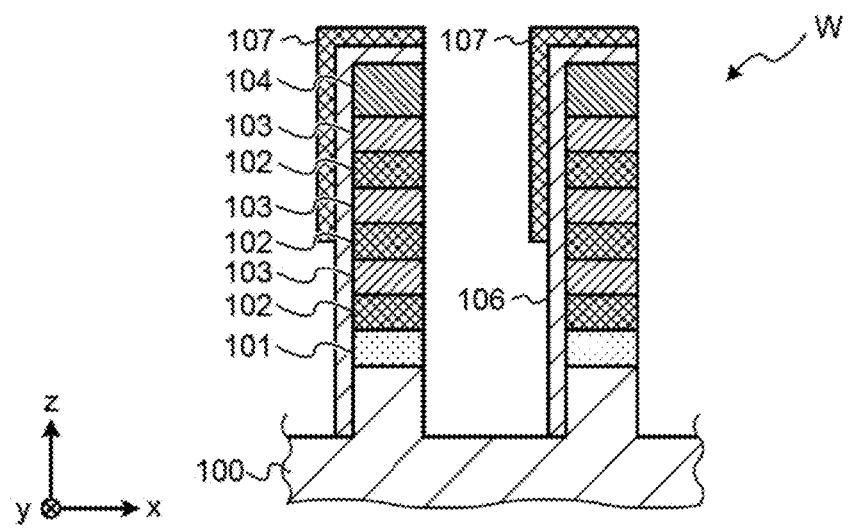
FIG. 7 illustrates an exemplary step of etching in the nano-sheet device manufacturing procedure according to the first embodiment of the present disclosure.

FIG. 7 illustrates an exemplary step of etching in the nano-sheet device manufacturing procedure according to the first embodiment of the present disclosure. As illustrated in FIG. 7, anisotropic etching is performed on substrate W.

In an exemplary implementation, the anisotropic etching is performed with directional reactive-io etching (RIE) so as to leave mask 107 on one side of the stack. Dielectric film 106 which was not protected by mask 107 is removed by the anisotropic etching. As shown in FIG. 7, dielectric film 106 on the side surface of each row not protected by mask 107 is removed from substrate W.

Figure 8:
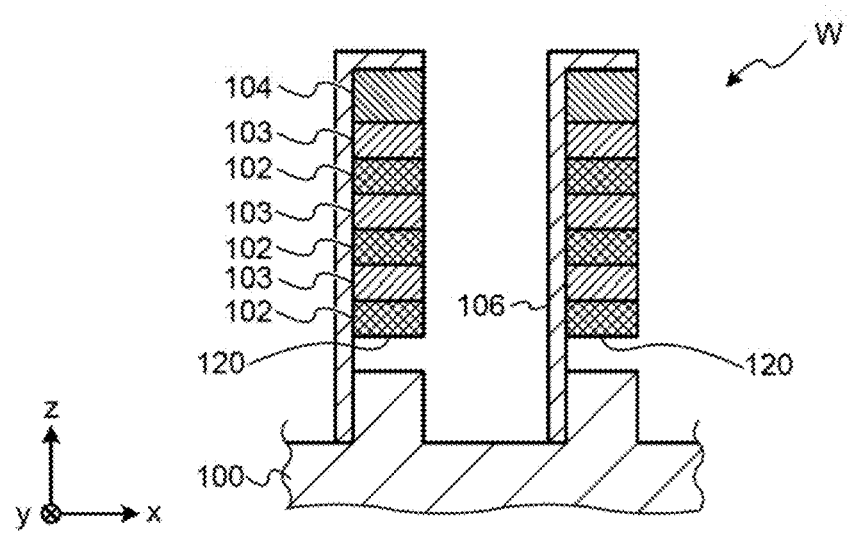
FIG. 8 illustrates an exemplary step of removing a sacrificial film in the nano-sheet device manufacturing procedure according to the first embodiment of the present disclosure.

FIG. 8 illustrates an exemplary step of removing a sacrificial film in the nano-sheet device manufacturing procedure according to the first embodiment of the present disclosure. As illustrated in FIG. 8, second sacrificial film 101 is removed from substrate W. In an exemplary implementation, second sacrificial film 101 is removed by wet etching including an etchant material such as NH4OH+ H2O2. However, other etchant materials may be used and/or other processes to remove second sacrificial film 101 may be utilized.

The removal of second sacrificial film 101 creates space 120 to be provided at the position where second sacrificial film 101 was located, between Si substrate 100 and first sacrificial film 102. Additionally, the structural configuration of dielectric film 106 upon substrate W prevents a collapse of the first sacrificial films 102 and Si-containing films 103. While the second sacrificial film 101 is removed, the first sacrificial films 102 having relatively less Ge content than second sacrificial film 101 is not removed.

Figure 9:
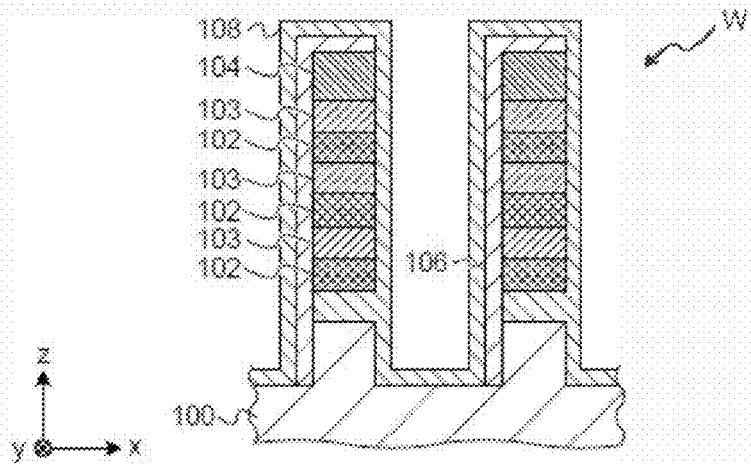
FIG. 9 illustrates an exemplary step of depositing a dielectric film in the nano-sheet device manufacturing procedure according to the first embodiment of the present disclosure.

FIG. 9 illustrates an exemplary step of depositing a dielectric film in the nano-sheet device manufacturing procedure according to the first embodiment of the present disclosure. As illustrated in FIG. 9, dielectric film 108 is conformally deposited upon substrate W. In exemplary implementations, dielectric film 108 is conformally deposited by ALD or CVD, however, another deposition process may be utilized. In the deposition, space 120 is filled with dielectric film 108. The dielectric film 108 may include, but not limited to, SiN film, SiOC film, SiOCN film or a film of another material composition.

Figure 10A:
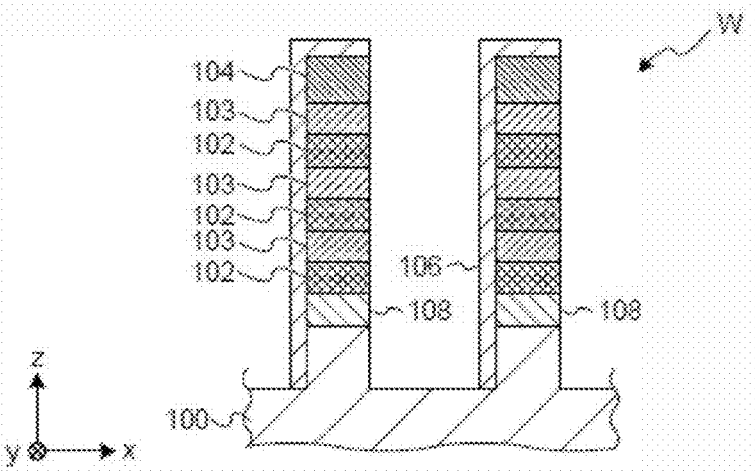
FIG. 10A illustrates an exemplary step of removing a first dielectric film in the nano-sheet device manufacturing procedure according to the first embodiment of the present disclosure.
Figure 10B:
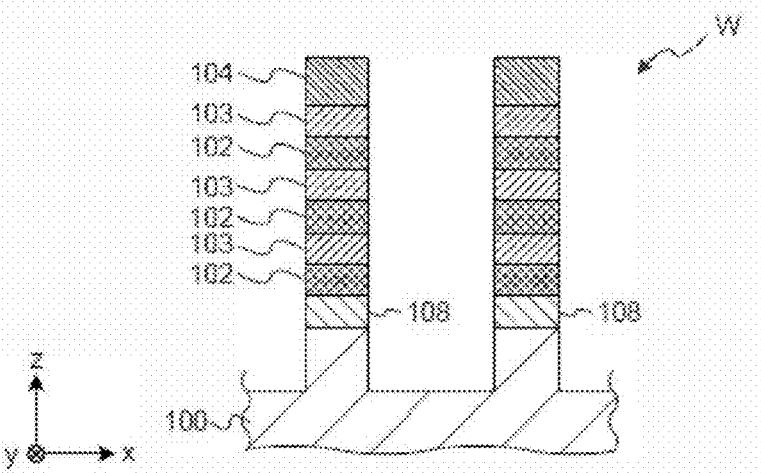
FIG. 10B illustrates an exemplary step of removing a second dielectric film in the nano-sheet device manufacturing procedure according to the first embodiment of the present disclosure.

FIG. 10A illustrates an exemplary step of removing a first dielectric film in the nano-sheet device manufacturing procedure according to the first embodiment of the present disclosure. FIG. 10B illustrates an exemplary step of removing a second dielectric film in the nano-sheet device manufacturing procedure according to the first embodiment of the present disclosure. As illustrated in FIG. 10A, exposed portions of dielectric film 108 are removed from substrate W by isotropic etching. By isotropic etching, only portions of the dielectric film 108 within space 120 remain in the substrate W. The isotropic etching may be wet etching or gas etching.

As illustrated in FIG. 10B, after dielectric film 108 is removed, dielectric film 106 is also removed. Dielectric film 106 may be removed by isotropic etching. In some implementations, dielectric film 108 and dielectric film 106 are removed in the same isotropic etching. In other implementations, dielectric film 106 is removed after dielectric film 108 by a separate etching process, isotropic or other process step.

Figure 11:
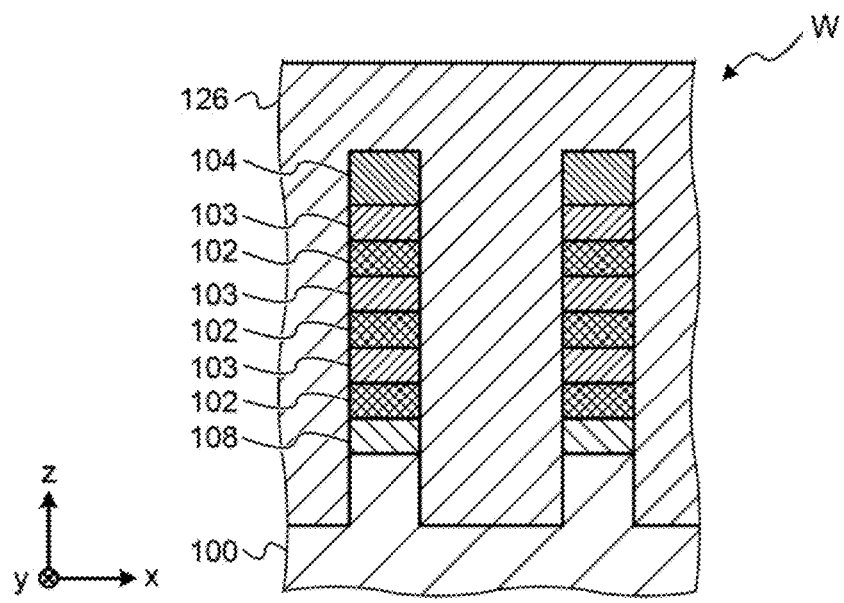
FIG. 11 illustrates an exemplary step of fling a trench in the nano-sheet device manufacturing procedure according to the first embodiment of the present disclosure.

FIG. 11 illustrates an exemplary step of fling a trench in the nano-sheet device manufacturing procedure according to the first embodiment of the present disclosure. As illustrated in FIG. 11, substrate W is covered with dielectric film 126. In an exemplary implementation, each trench 105 (labeled in FIG. 4) between the rows of substrate W is filled with dielectric film 126. Dielectric film covers hard mask 104 at the top of each row and a top surface of Si substrate 100 at a bottom of each trench 105. In an exemplary implementation, dielectric film 126 serves as a Shallow Trench Isolation (STI) for substrate W.

FIG. 12 illustrates an exemplary step of exposing the hard mask in the nano-sheet device manufacturing procedure according to the first embodiment of the present disclosure. As illustrated in FIG. 12, CMP is applied to dielectric film 126, removing a top of layer of dielectric film 126 from substrate W and exposing the hard mask 104. In an exemplary implementation, a top layer of dielectric film 126 is removed so that a top surface of hard mask 104 is flush with a top surface of dielectric film 126 in each trench 105.

Figure 13:
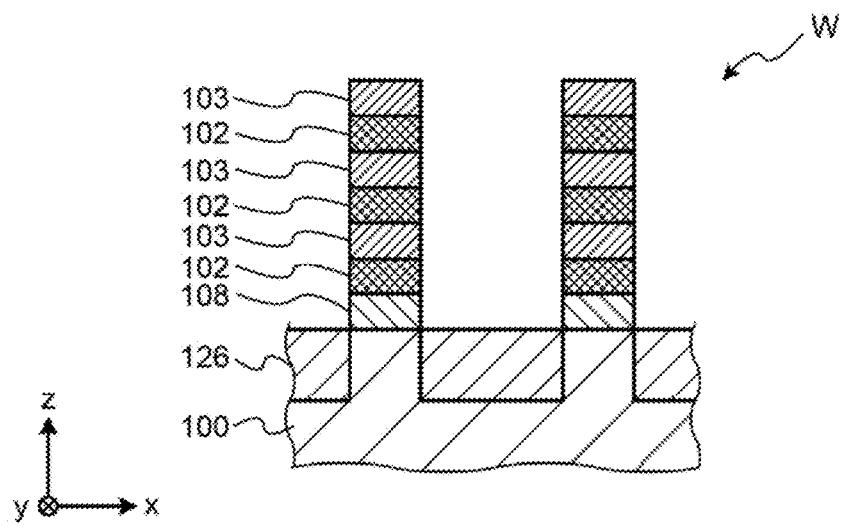
FIG. 13 illustrates an exemplary step of removing the dielectric film and the hard mask in the nano-sheet device manufacturing procedure according to the first embodiment of the present disclosure.

FIG. 13 illustrates an exemplary step of removing the dielectric film and the hard mask in the nano-sheet device manufacturing procedure according to the first embodiment of the present disclosure. As illustrated in FIG. 13, a portion of dielectric film 126 is removed from trench 105 so that a remainder of dielectric film 126 is flush with a top surface of Si substrate 100. Additionally hard mask 104 is removed, exposing a top layer of Si-containing film 103. In an exemplary implementation, the portion of dielectric film 126 and hard mask 104 are removed by anisotropic etching.

Figure 14:
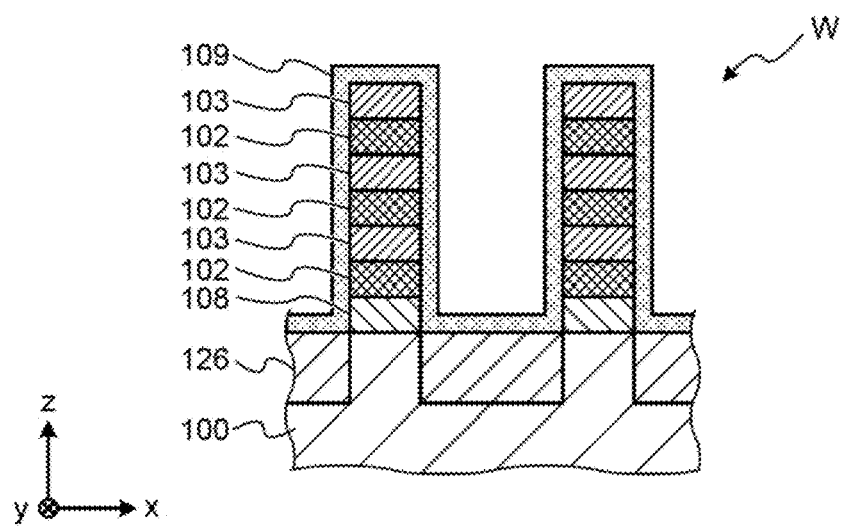
FIG. 14 illustrates an exemplary step of forming depositing a dielectric film in the nano-sheet device manufacturing procedure according to the first embodiment of the present disclosure.

FIG. 14 illustrates an exemplary step of forming depositing a dielectric film in the nano-sheet device manufacturing procedure according to the first embodiment of the present disclosure. As illustrated in FIG. 14, dielectric film 109 is conformally deposited upon substrate W. In exemplary implementations, dielectric film 109 is conformally deposited by ALD or CVD, however, another deposition process may be utilized. In the deposition, the remaining portion of dielectric film 126 is covered by the deposited dielectric film 109. The dielectric film 109 may include, but not limited to, SiN film, SiOC film, SiOCN film or a film of another material composition.

Figure 15:
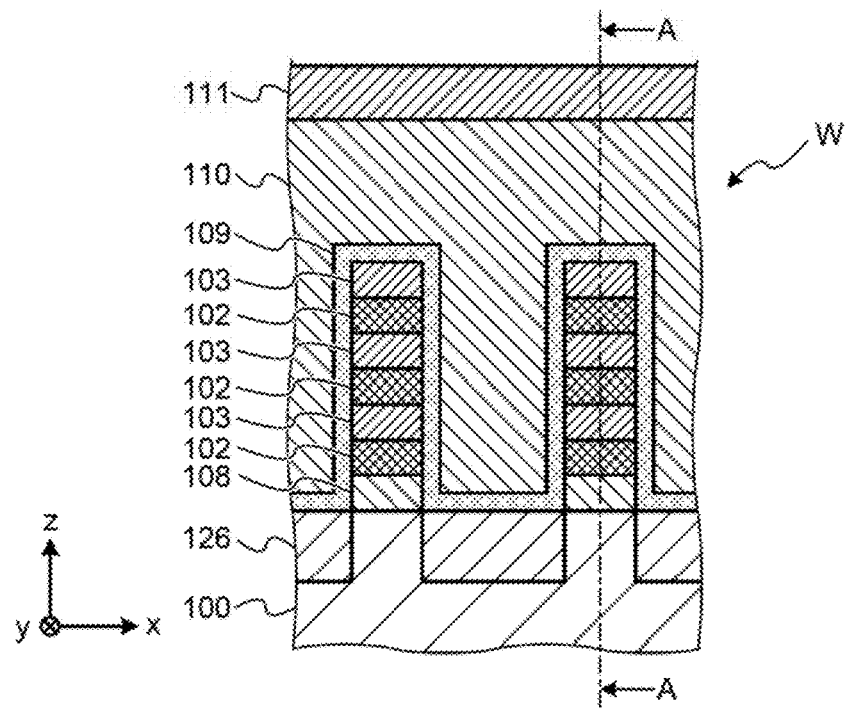
FIG. 15 illustrates an exemplary step of forming a mask in the nano-sheet device manufacturing procedure according to the first embodiment of the present disclosure.

FIG. 15 illustrates an exemplary step of forming a mask in the nano-sheet device manufacturing procedure according to the first embodiment of the present disclosure. As illustrated in FIG. 15, each trench 105 between the rows of substrate W is filled with Si-containing film 110 and a layer of Si-containing film 110 is provided over a top surface of dielectric film 109. In an exemplary implementation, the Si-containing film 110 includes amorphous silicon (a-Si). However, other Si-containing films may be used as Si-containing film 110. After Si-containing film 110 is added to substrate W, mask 111 is formed upon a top surface of Si-containing film 110.

Figure 16:
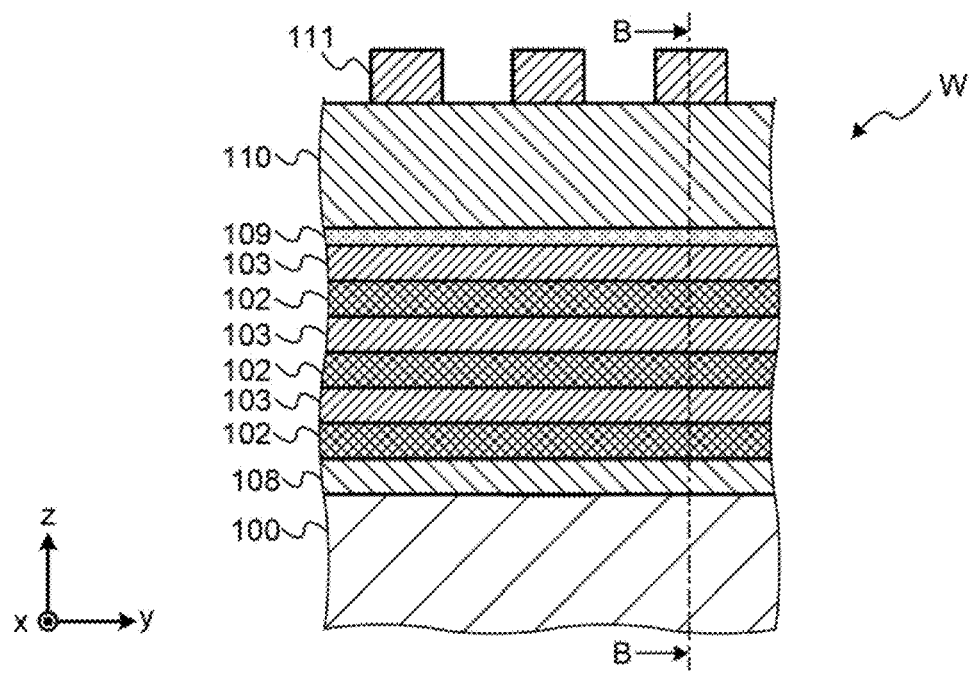
FIG. 16 illustrates an exemplary step of patterning the mask in the nano-sheet device manufacturing procedure according to the first embodiment of the present disclosure.

FIG. 16 illustrates an exemplary step of patterning the mask in the nano-sheet device manufacturing procedure according to the first embodiment of the present disclosure. In FIG. 16, a Y-Z axis cross section of substrate W is illustrated as viewed along the X-axis. This view is in contrast to FIGS. 3-15, in which an X-Z axis cross section of substrate W is illustrated as viewed along the Y-axis. In particular, FIG. 16 illustrates an A-A cross section view taken at line A-A shown in FIG. 15. FIG. 15 illustrates an B-B cross section view taken at line B-B shown in FIG. 16.

As illustrated in FIG. 16, mask 111 is worked into a shape of a gate electrode. Mask 111 is formed into columns that run along the X-axis. Each column of mask 111 sits upon Si-containing film 110. In an exemplary implementation, mask 11 is etched into the columns, which are perpendicular to the rows of first sacrificial films 102, Si-containing films 103 and dielectric 108 shown in FIG. 15. However, other processes to shape mask 111 into columns as shown in FIG. 16 may be performed.

Figure 17:
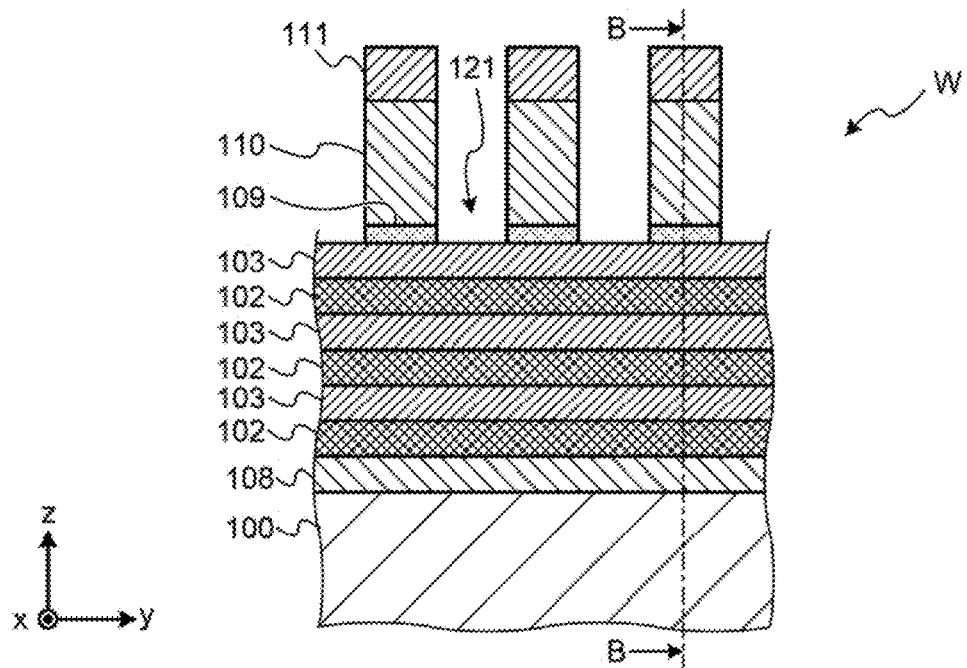
FIG. 17 illustrates an exemplary step of etching along the mask in the nano-sheet device manufacturing procedure according to the first embodiment of the present disclosure.

FIG. 17 illustrates an exemplary step of etching along the mask in the nano-sheet device manufacturing procedure according to the first embodiment of the present disclosure. As shown in FIG. 17, anisotropic etching is performed along the columns of mask 111 to form trenches 121 that extend down to a top layer of Si-containing film 103. The trenches 121 are formed by the anisotropic etching, which etches away Si-containing film 110 and dielectric film 109 that is not protected by mask 111. The unprotected Si-containing film 110 and dielectric film 109 is etched away to a top layer of Si-containing film 103. However, Si-containing film 110 and dielectric film 109 may be removed by processes other than anisotropic etching.

Figure 18:
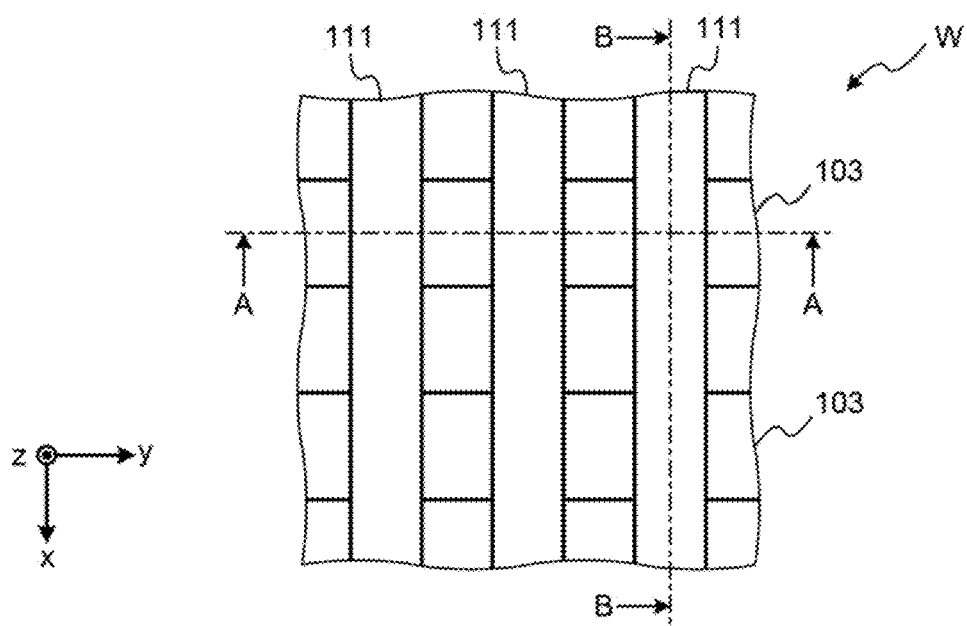
FIG. 18 illustrates the substrate in FIG. 17 when viewed along the Z-axis.

FIG. 18 illustrates the substrate W after the processing step of FIG. 17 when viewed along the Z-axis. In particular, FIG. 18 illustrates the substrate W as viewed from above and along the Z-axis. FIG. 18 shows how the A-A and B-B cross sections relate to each other. By removing the unprotected Si-containing film 110 and dielectric film 109 as in FIG. 17, the remaining Si-containing film 110 is formed into a gate structure.

Figure 19:
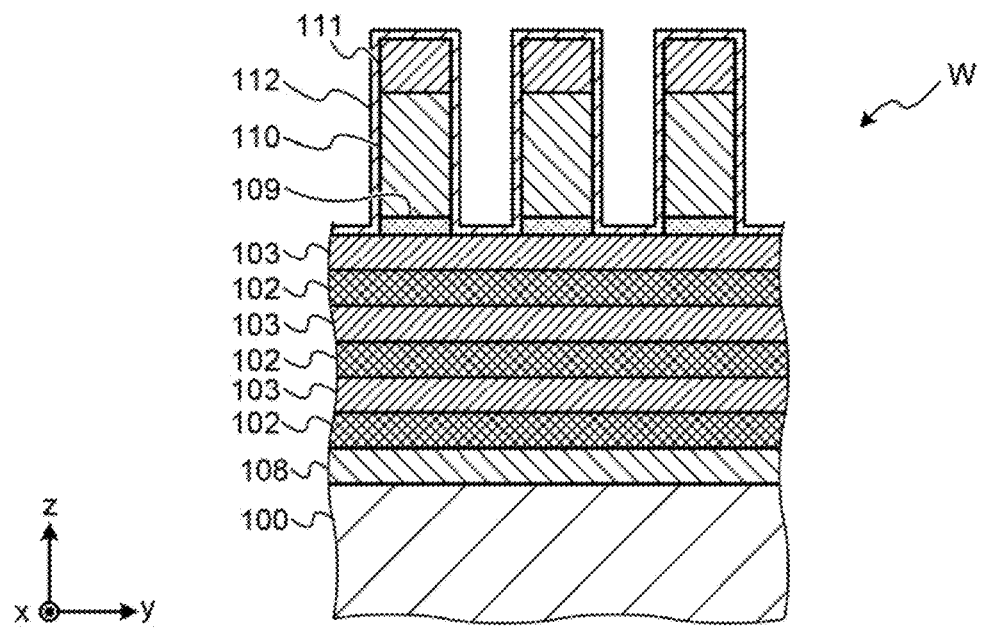
FIG. 19 illustrates an exemplary step of depositing a dielectric film in the nano-sheet device manufacturing procedure according to the first embodiment of the present disclosure.

FIG. 19 illustrates an exemplary step of depositing a dielectric film in the nano-sheet device manufacturing procedure according to the first embodiment of the present disclosure. As illustrated in FIG. 19, dielectric film 112 is conformally deposited upon substrate W, covering the exposed top layer of Si-containing film 103, the sides of the columns including dielectric film 109, Si-containing film 110 and mask 111, and an exposed top layer of mask 111. The dielectric film 112 may be conformally deposited by ALD or CVD. However, other processes may be used to deposit dielectric film 112.

In an exemplary implementation, the dielectric film 112 serves as a gate spacer. The dielectric film 112 may include, but not limited to, SiOC film or a film of another material composition.

Figure 20:
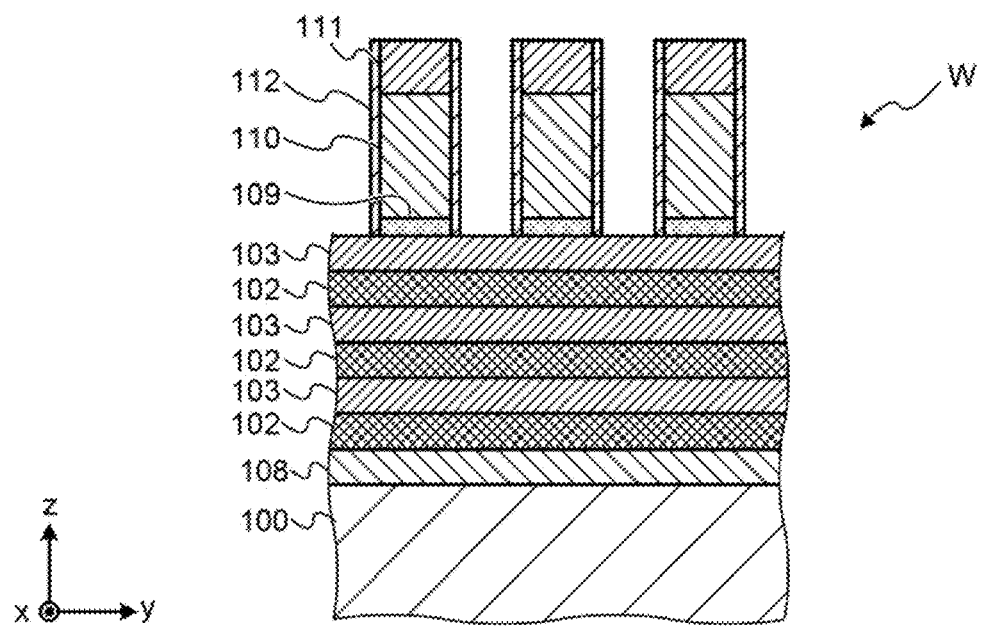
FIG. 20 illustrates an exemplary step of removing the dielectric film in the nano-sheet device manufacturing procedure according to the first embodiment of the present disclosure.

FIG. 20 illustrates an exemplary step of removing the dielectric film in the nano-sheet device manufacturing procedure according to the first embodiment of the present disclosure.

As illustrated in FIG. 20, exposed portions of dielectric film 112 along the Z-axis are removed from substrate W by anisotropic etching. By anisotropic etching, the dielectric film 112 on a top surface of Si-containing film 103 is removed and the dielectric film on a top surface of mask 111 is removed. Only portions of the dielectric film 112 on the sides of the columns including dielectric film 109, Si-containing film 110 and mask 111 remain in the substrate W. In an exemplary implementation, the dielectric film 112 is removed by anisotropic etching. However, other processes such as isotropic etching, wet etching or gas etching, may be performed to remove dielectric film 112.

Figure 21:
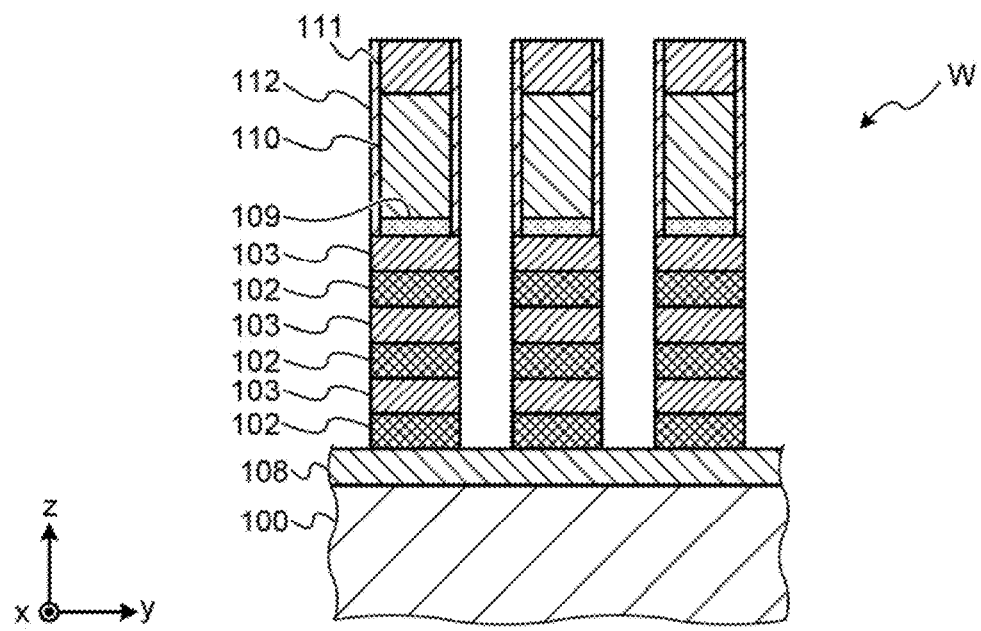
FIG. 21 illustrates an exemplary step of anisotropic etching in the nano-sheet device manufacturing procedure according to the first embodiment of the present disclosure.

FIG. 21 illustrates an exemplary step of anisotropic etching in the nano-sheet device manufacturing procedure according to the first embodiment of the present disclosure. As illustrated in FIG. 21, anisotropic etching is performed to extend trench 121 down to a top surface of dielectric film 108. The anisotropic etching removes the first sacrificial films 102 and Si-containing films 103 that are not protected by mask 111. The anisotropic etching removes the first sacrificial films 102 and Si-containing films 103 that, along the Z-axis, are not below mask 111 and dielectric film 112. In an exemplary implementation, the dielectric film 112 is removed by anisotropic etching. However, other processes such as isotropic etching, wet etching or gas etching, may be performed to remove dielectric film 112.

Figure 22:
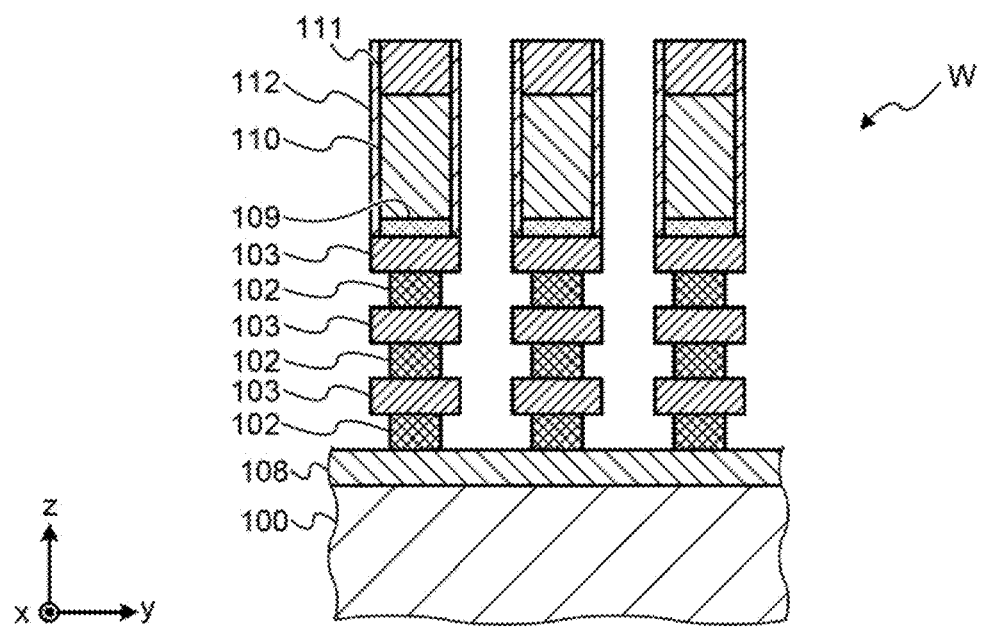
FIG. 22 illustrates an exemplary step of isotropic etching in the nano-sheet device manufacturing procedure according to the first embodiment of the present disclosure.

FIG. 22 illustrates an exemplary step of isotropic etching in the nano-sheet device manufacturing procedure according to the first embodiment of the present disclosure. As illustrated in FIG. 22, isotropic etching is performed to etch recesses along the first sacrificial films 102 in a lateral direction. When viewing a Y-Z cross section of substrate W along the X-axis, each section of first sacrificial film 102 is etched to have a smaller diameter along the Y-axis than diameters of adjacent sections of Si-containing films 103. The recesses are created by etching away portions of the first sacrificial films 102. In an exemplary implementation, the recesses are created by isotropic etching. However, other processes such as anisotropic etching, wet etching or gas etching, may be performed to create the recesses.

Figure 23:
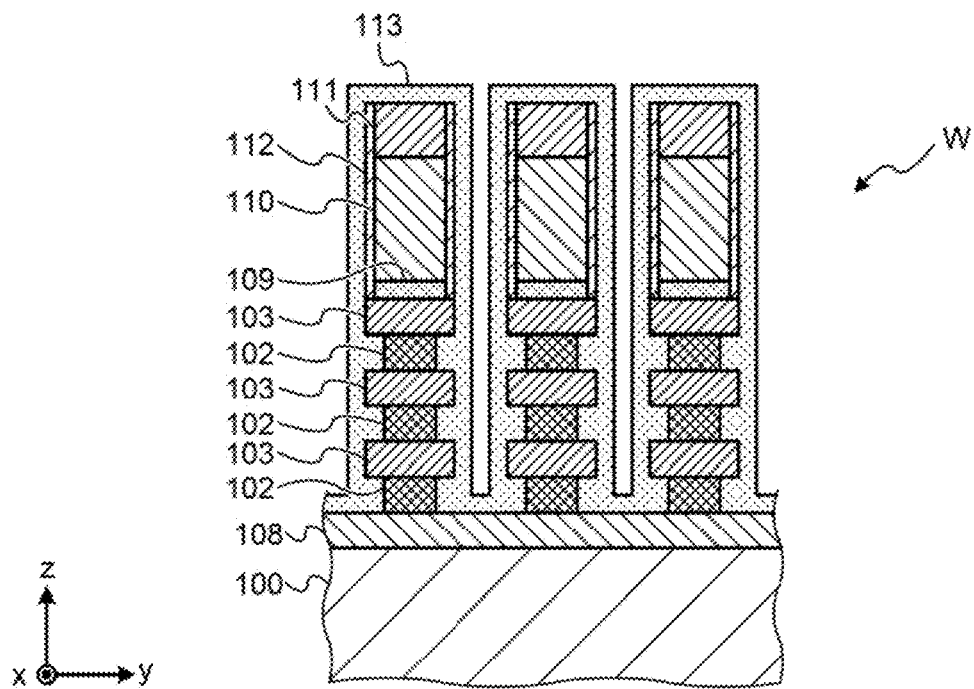
FIG. 23 illustrates an exemplary step of depositing a dielectric film in the nano-sheet device manufacturing procedure according to the first embodiment of the present disclosure.

FIG. 23 illustrates an exemplary step of depositing a dielectric film in the nano-sheet device manufacturing procedure according to the first embodiment of the present disclosure. As illustrated in FIG. 23, a dielectric film 113 is conformally deposited upon substrate W. In exemplary implementations, dielectric film 113 is conformally deposited by ALD or CVD, however, another deposition process may be utilized. In the deposition, the recesses adjacent to first sacrificial films 102 are filled by dielectric film 113. Additionally, dielectric film 113 is deposited on a top surface of dielectric film 108, a top surface of mask 111, and side surfaces of mask 111, dielectric film 112 and Si-containing film 103. The dielectric film 113 may include, but is not limited to, SiN film, SiOC film, SiOCN film or a film of another material composition.

Figure 24:
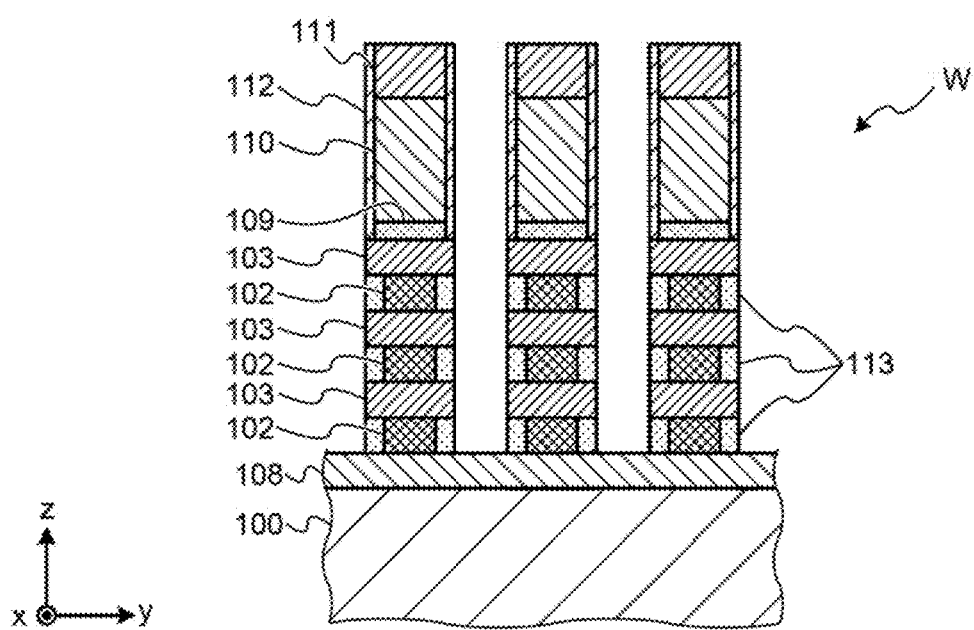
FIG. 24 illustrates an exemplary step of etching the dielectric film in the nano-sheet device manufacturing procedure according to the first embodiment of the present disclosure.

FIG. 24 illustrates an exemplary step of etching the dielectric film in the nano-sheet device manufacturing procedure according to the first embodiment of the present disclosure. As illustrated in FIG. 24, isotropic etching is performed to remove portions of the dielectric film 113 upon substrate W except for the dielectric film 113 in the recesses adjacent to first sacrificial films 102. The isotropic etching is performed to remove the dielectric film on a top surface of mask 111, on exposed top surfaces of dielectric film 108, and on side surfaces of dielectric film 112 and Si-containing films 103. After the isotropic etching, dielectric film 113 remains in the recesses adjacent to first sacrificial films 102. In an exemplary implementation, portions of the dielectric film 113 is removed by isotropic etching. However, other processes such as anisotropic etching, wet etching or gas etching, may be performed to remove the portions of the dielectric film 113.

Finally, after the etching is completed so that dielectric film 113 remains in the recesses adjacent to first sacrificial films 102, CMOS manufacturing processes such as epitaxial growth of source/drain electrode may be performed.

Referring back to FIGS. 1 and 2, due to the high-Ge-content in the second sacrificial film 101, cracks in a crystal are more likely to be caused by annealing in the second sacrificial film 101 than in other films. Such cracks in the crystal of the second sacrificial film 101 may lead to crack propagation to the first sacrificial films 102 and the Si-containing films 103.

The nano-sheet device manufacturing procedures illustrated in FIGS. 3-24 address these problems by removing a second sacrificial film at an earlier manufacturing stage. As a result, crack propagation to other films in the substrate W is less likely to be caused in a subsequent annealing process. Therefore, the resulting nano-sheet device will have less defects.

FIGS. 25-30 illustrate an exemplary nano-sheet device manufacturing procedure according to a second embodiment of the present disclosure. The second embodiment of the nano-sheet device manufacturing procedure begins with the process steps illustrated in FIGS. 3 and 4.

Second sacrificial film 101 is deposited upon silicon substrate 100. First sacrificial films 102 and Si-containing films 103 are alternately deposited on the second sacrificial film 101, one after another. The material compositions of the second sacrificial film 101, the first sacrificial film 102 and the Si-containing films 103 may be the same as discussed above with respect to FIG. 3.

A hard mask 104 is deposited and patterned upon the top layer of Si-containing film 103 of substrate W. Hard mask 104 may be SiN or another hard mask material composition. After hard mask 104 is deposited and patterned upon the top layer of Si-containing film 103, the nano-sheet device manufacturing procedure proceeds to form trench 105 as discussed above with respect to FIG. 4.

Figure 25:
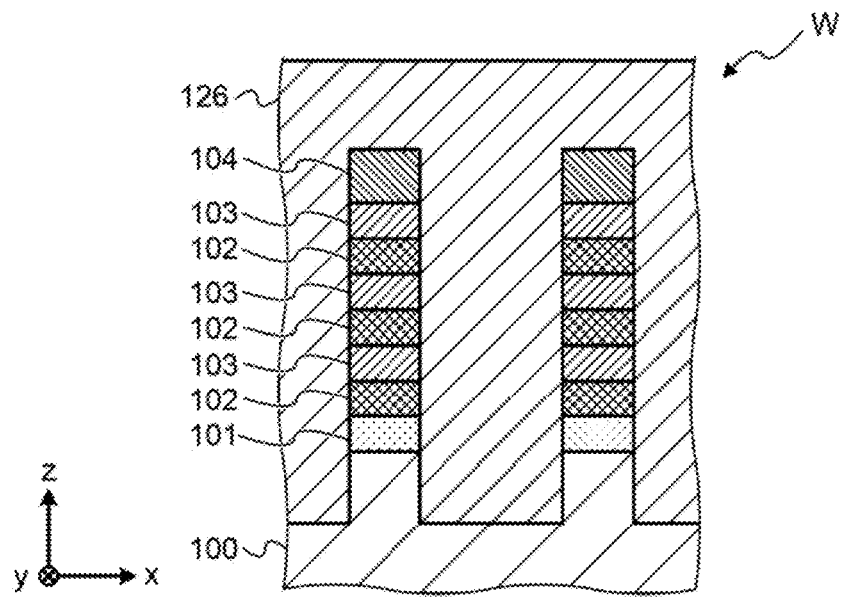
FIG. 25 illustrates an exemplary step of filling a trench with dielectric film in a nano-sheet device manufacturing procedure according to the second embodiment of the present disclosure.

FIG. 25 illustrates an exemplary step of filling a trench with dielectric film in a nano-sheet device manufacturing procedure according to the second embodiment of the present disclosure. As illustrated in FIG. 5, the trenches 105 are filled with dielectric film 126. The dielectric film 126 is formed to cover the exposed surfaces of Si substrate 100, side surfaces of second sacrificial films 101, first sacrificial films 102, Si-containing films 103 and hard mask 104. The dielectric film 126 may be conformally deposited by ALD, CVD, or another deposition process. In exemplary implementations, dielectric film 126 may comprise SiO2 or another dielectric material composition.

Figure 26:
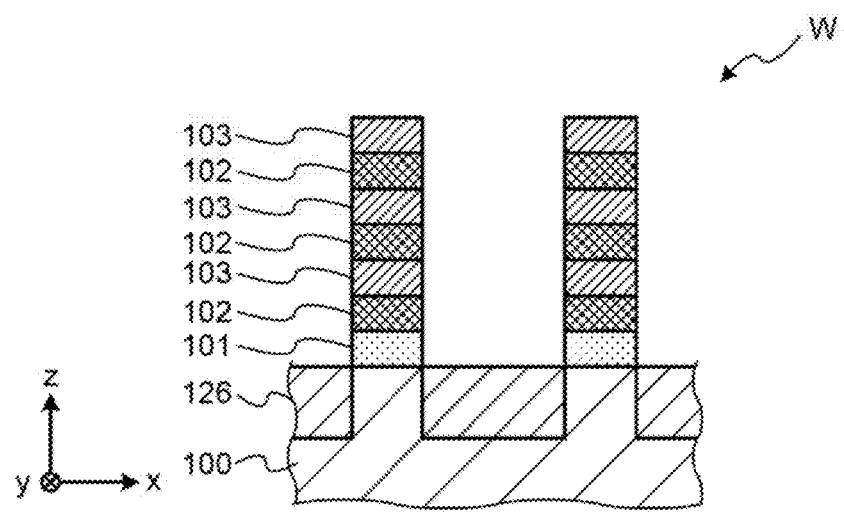
FIG. 26 illustrates an exemplary step of removing the hard mask in the nano-sheet device manufacturing procedure according to the second embodiment of the present disclosure.

FIG. 26 illustrates an exemplary step of removing the hard mask in the nano-sheet device manufacturing procedure according to the second embodiment of the present disclosure. In an exemplary implementation, CMP is applied to the top layer of the dielectric film 126. After application of CMP to the dielectric film 126, recesses in the dielectric film 126 are created so as to expose side surfaces of the second sacrificial films 101, the first sacrificial films 102 and the Si-containing films 103. Additionally, the hard mask 104 is removed to expose a top surface of Si-containing film 103. After creation of the recesses and removal of the hard mask 104, a portion of the dielectric film 126 remains that is in contact with Si substrate 100. In an exemplary implementation, the portion of dielectric film 126 and hard mask 104 are removed by anisotropic etching or other process.

Figure 27:
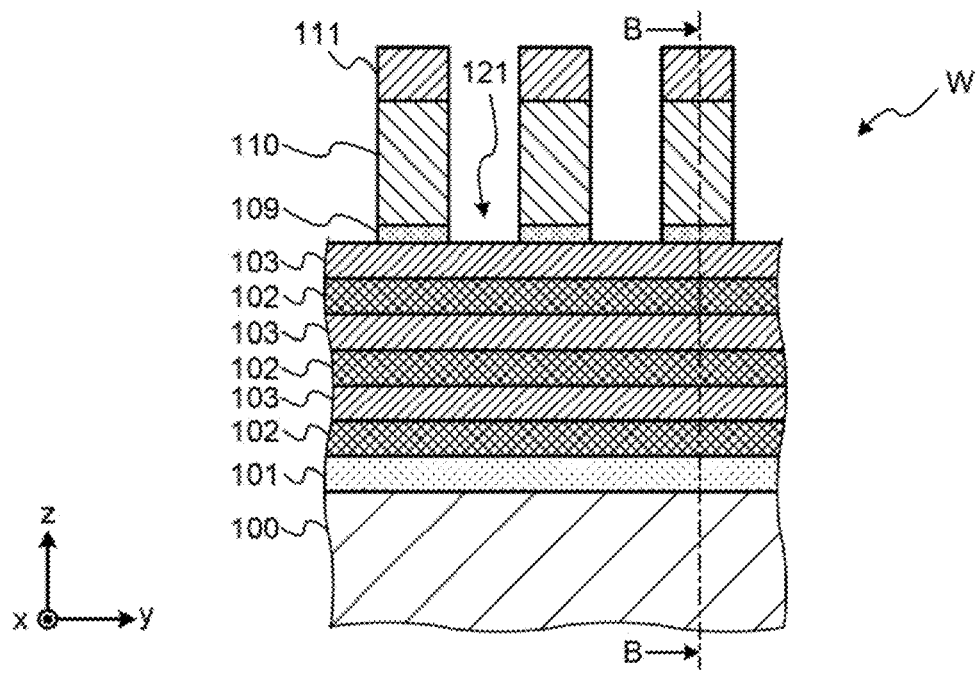
FIG. 27 illustrates a substrate formed by steps in the nano-sheet device manufacturing procedure according to the second embodiment of the present disclosure.

The second embodiment of the nano-sheet device manufacturing procedure next continues with the steps illustrated in FIGS. 15-17. Each trench 105 between the rows of substrate W is filled with Si-containing film 110 and a layer of Si-containing film 110 is provided over a top surface of dielectric film 109. Mask 111 is formed into columns, and each column of mask 111 sits upon Si-containing film 110. Anisotropic etching is then performed along the columns of mask 111 to form trenches 121 that extend down to a top layer of Si-containing film 103. Unprotected Si-containing film 110 and dielectric film 109 is etched away to a top layer of Si-containing film 103. However, Si-containing film 110 and dielectric film 109 may be removed by processes other than anisotropic etching. A result of these processing steps is illustrated in FIG. 27. Additionally, when the substrate W is viewed from above as shown in FIG. 18, the A-A cross section and the B-B cross section relate to each other.

Figure 28:
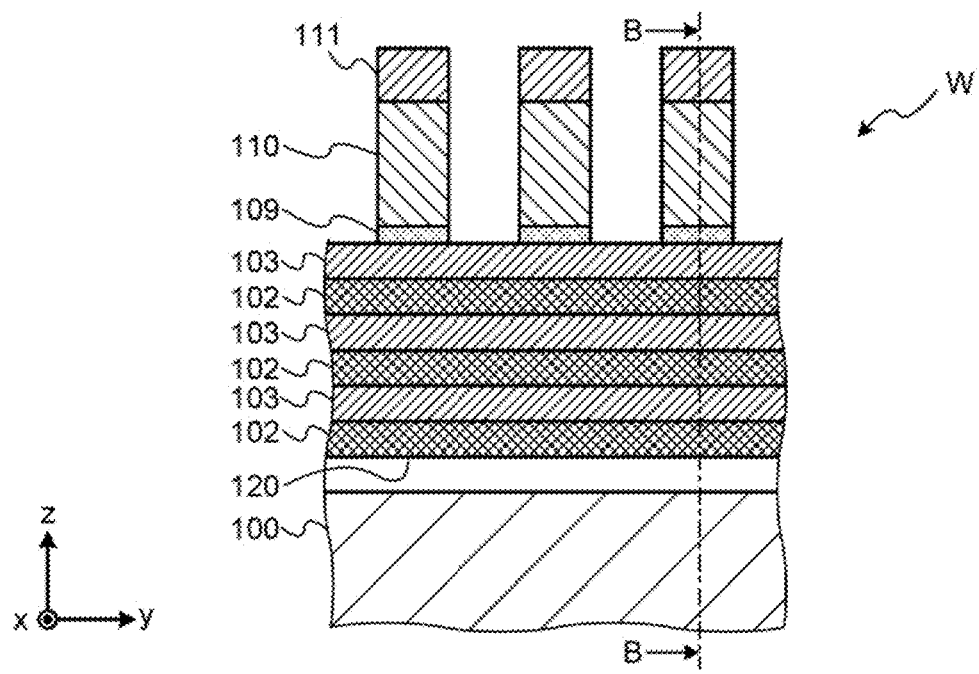
FIG. 28 illustrates an exemplary step of removing a sacrificial film in the nano-sheet device manufacturing procedure according to the second embodiment of the present disclosure.

FIG. 28 illustrates an exemplary step of removing a sacrificial film in the nano-sheet device manufacturing procedure according to the second embodiment of the present disclosure. As illustrated in FIG. 28, second sacrificial film 101 is removed from substrate W. In an exemplary implementation, second sacrificial film 101 is removed by wet etching. An etchant used for wet etching includes, for example, NH4OH+H2O2. However, other etchants and other removal processes may be used to remove first sacrificial film 101. By removing first sacrificial film 101, spaces 120 are provided at the position where the second sacrificial film 101 was previously located.

Figure 29:
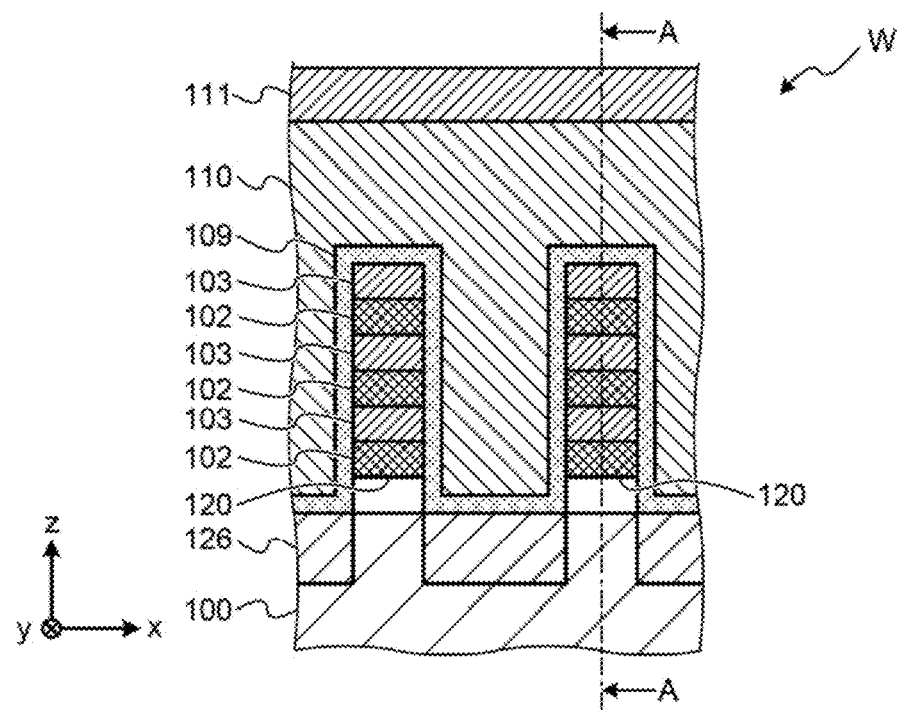
FIG. 29 illustrates the substrate in FIG. 28 as viewed along the Y-axis.

FIG. 29 illustrates the substrate in FIG. 28 as viewed along the Y-axis. As illustrated in FIG. 29, the spaces 120 are surrounded by Si substrate 100, dielectric film 109 and first sacrificial films 102. Although above a vacant space 120, the first sacrificial films 102 and the Si-containing films 103 are supported by the Si-containing film 110 and the dielectric film 109. This structural configuration prevents pattern collapse. While the second sacrificial film 101 with high-Ge-content is removed, but the first sacrificial films 102 with relatively less Ge content remains.

Figure 30:
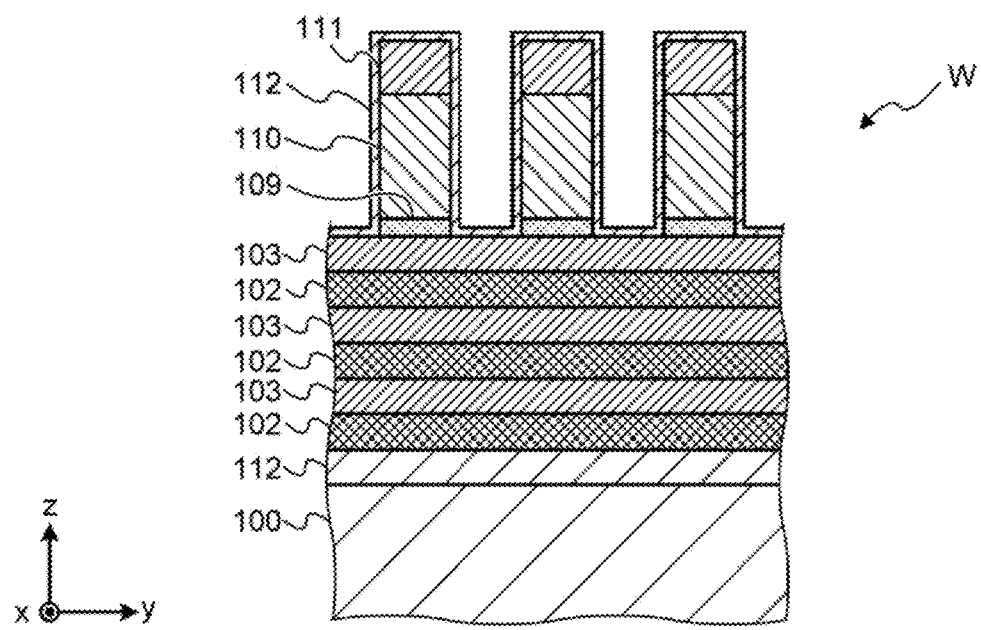
FIG. 30 illustrates an exemplary step of depositing a dielectric film in the nano-sheet device manufacturing procedure according to the second embodiment of the present disclosure.

FIG. 30 illustrates an exemplary step of depositing a dielectric film in the nano-sheet device manufacturing procedure according to the second embodiment of the present disclosure. As illustrated in FIG. 30, dielectric film 112 is conformally deposited upon substrate W. The dielectric film 112 serves as a gate spacer, and may be conformally deposited by ALD, CVD, or another deposition process. It is noted that dielectric film 112 is deposited onto mask 111, which is not removed prior to deposition of dielectric film 112. By conformally depositing dielectric film 112, each space 120 is filled with dielectric film 112. The dielectric film 112 may include, but is not limited to, a SiOC film.

After deposition of dielectric film 112 onto substrate W, the second embodiment of the nano-sheet device manufacturing procedure may continue with performance of the processing steps illustrated in FIGS. 20-24.

FIGS. 31-37 illustrate an exemplary nano-sheet device manufacturing procedure according to a third embodiment of the present disclosure.

The third embodiment of the nano-sheet device manufacturing procedure begins with the deposition steps illustrated in FIGS. 3 and 4. The third embodiment of the nano-sheet device manufacturing procedure then continues with the process steps illustrated in FIGS. 25-27. The third embodiment of the nano-sheet device manufacturing procedure then continues onto the deposition illustrated in FIG. 31.

Figure 31:
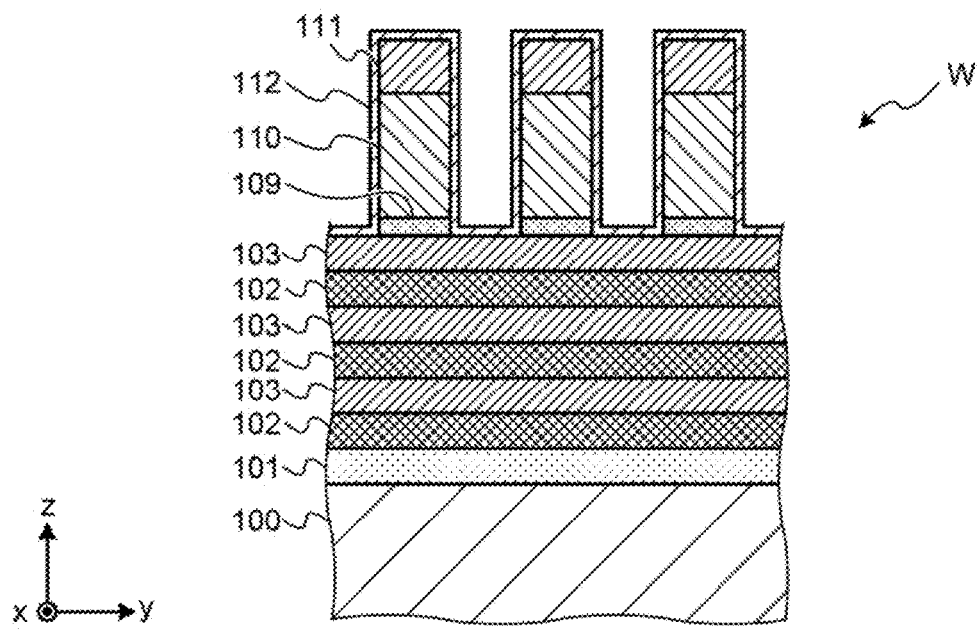
FIG. 31 illustrates an exemplary step of depositing a dielectric film in a nano-sheet device manufacturing procedure according to the third embodiment of the present disclosure.

FIG. 31 illustrates an exemplary step of depositing a dielectric film in a nano-sheet device manufacturing procedure according to the third embodiment of the present disclosure. As illustrated in FIG. 31, dielectric film 112 is conformally deposited onto substrate W. The dielectric film 112 serves as a gate spacer, and may be conformally deposited by ALD, CVD, or another deposition process. The dielectric film 112 may include, but is not limited to, a SiOC film.

Figure 32:
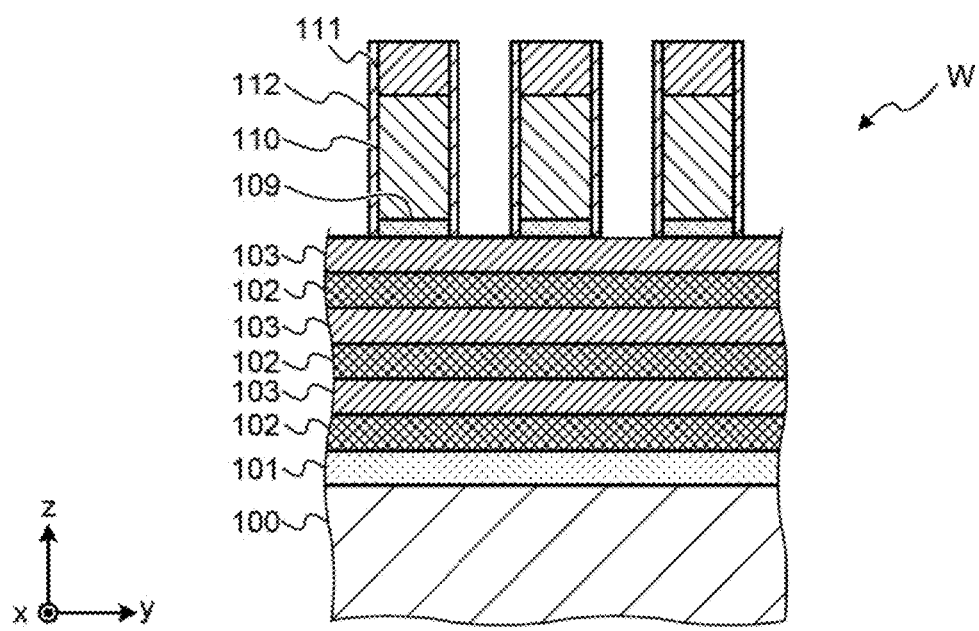
FIG. 32 illustrates an exemplary step of removing a part of the dielectric film in the nano-sheet device manufacturing procedure according to the third embodiment of the present disclosure.

FIG. 32 illustrates an exemplary step of removing a part of the dielectric film in the nano-sheet device manufacturing procedure according to the third embodiment of the present disclosure. As illustrated in FIG. 32, a part of the dielectric film 112, located at a bottom of each trench and on a top surface of Si-containing film 103, is removed. Dielectric film on a top surface of mask 111 is also removed. In an exemplary implementation, the dielectric film is removed by anisotropic etching. However, other removal processes, such as isotropic etching, may be performed to remove the parts of the dielectric film. After removal, dielectric film 112 remains on side surfaces of dielectric film 109, Si-containing film 110 and mask 111.

Figure 33:
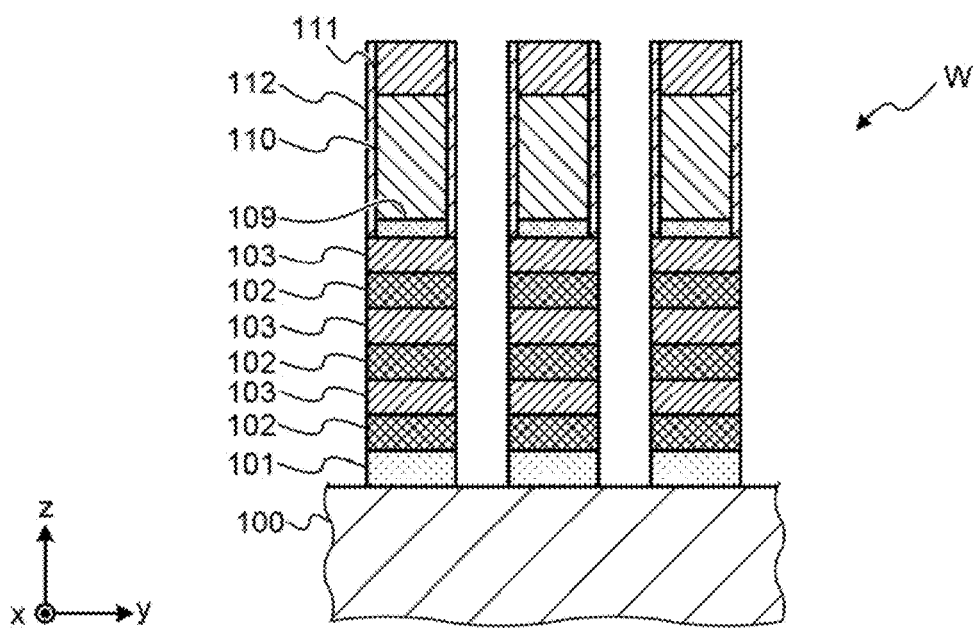
FIG. 33 illustrates an exemplary step of anisotropic etching in the nano-sheet device manufacturing procedure according to the third embodiment of the present disclosure.

FIG. 33 illustrates an exemplary step of anisotropic etching in the nano-sheet device manufacturing procedure according to the third embodiment of the present disclosure. As illustrated in FIG. 33, anisotropic etching is performed to extend trench down to a top surface of Si-substrate 100. The anisotropic etching removes the second sacrificial film, the first sacrificial films 102 and the Si-containing films 103 that are not protected by mask 111. The anisotropic etching removes the second sacrificial film 101, the first sacrificial films 102 and the Si-containing films 103 that, along the Z-axis, are not below mask 111 and dielectric film 112. In an exemplary implementation, the dielectric film 112 is removed by anisotropic etching. However, other processes such as isotropic etching, wet etching or gas etching, may be performed to remove dielectric film 112.

Figure 34:
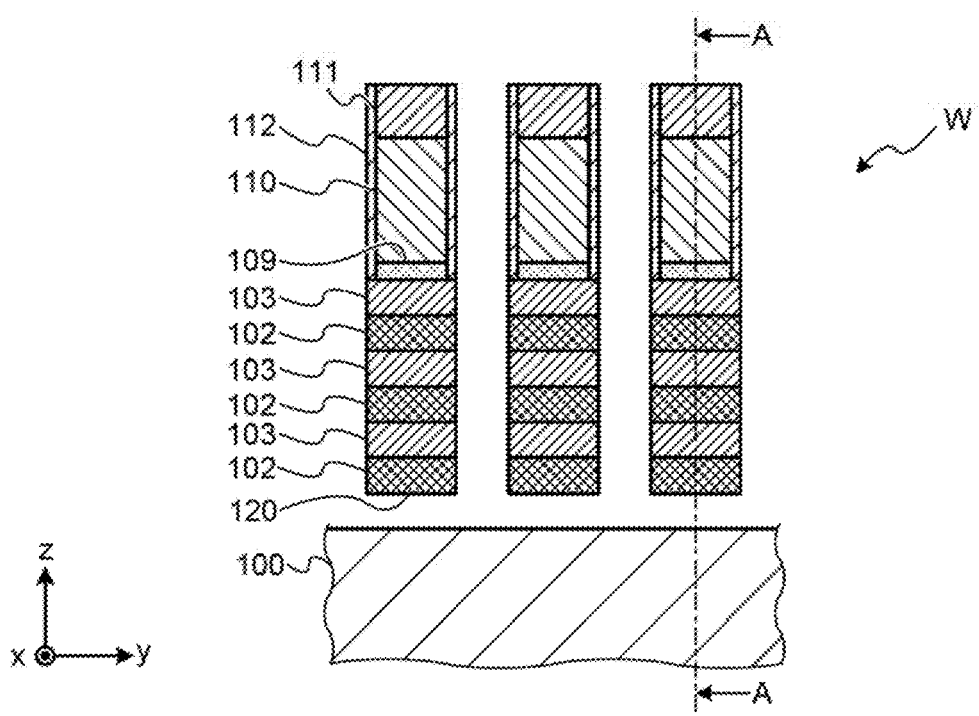
FIG. 34 illustrates an exemplary step of removing a sacrificial film in the nano-sheet device manufacturing procedure according to the third embodiment of the present disclosure.

FIG. 34 illustrates an exemplary step of removing a sacrificial film in the nano-sheet device manufacturing procedure according to the third embodiment of the present disclosure. As illustrated in FIG. 34, the remaining second sacrificial film 101 is removed from substrate W. In an exemplary implementation, second sacrificial film 101 is removed by wet etching. An etchant used for wet etching includes, for example, NH4OH+H2O2. However, other etchants and other removal processes may be used to remove first sacrificial film 101. By removing first sacrificial film 101, spaces 120 are provided at the position where the second sacrificial film 101 was previously located.

Although above a vacant space 120, the first sacrificial films 102 and the Si-containing films 103 are supported by the Si-containing film 110 and the dielectric film 109. This structural configuration prevents pattern collapse. While the second sacrificial film 101 with high-Ge-content is removed, but the first sacrificial films 102 with relatively less Ge content remains.

Figure 35:
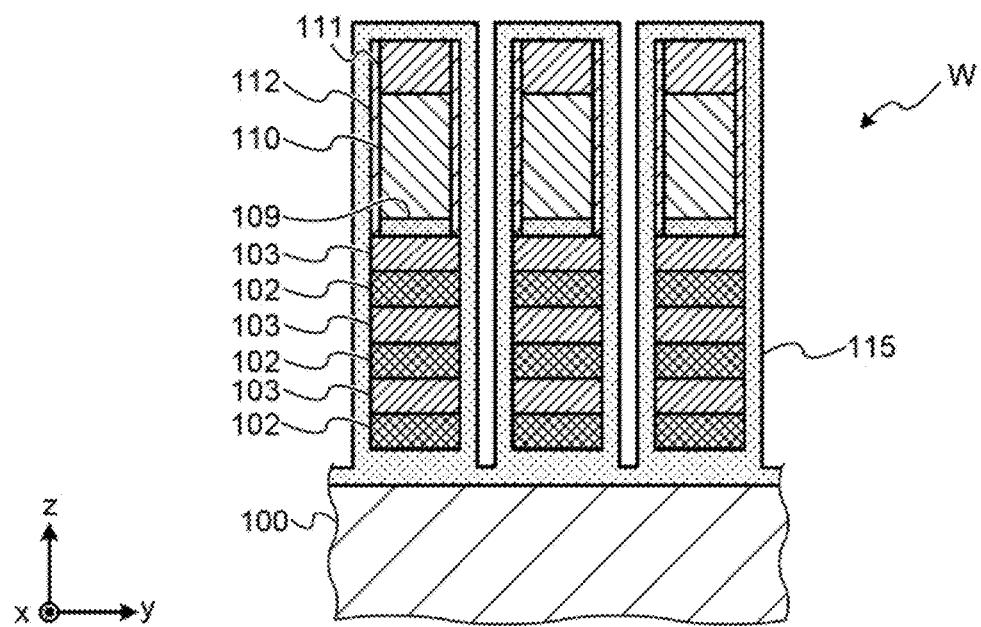
FIG. 35 illustrates an exemplary step of depositing a dielectric film in the nano-sheet device manufacturing procedure according to the third embodiment of the present disclosure.
Figure 36:
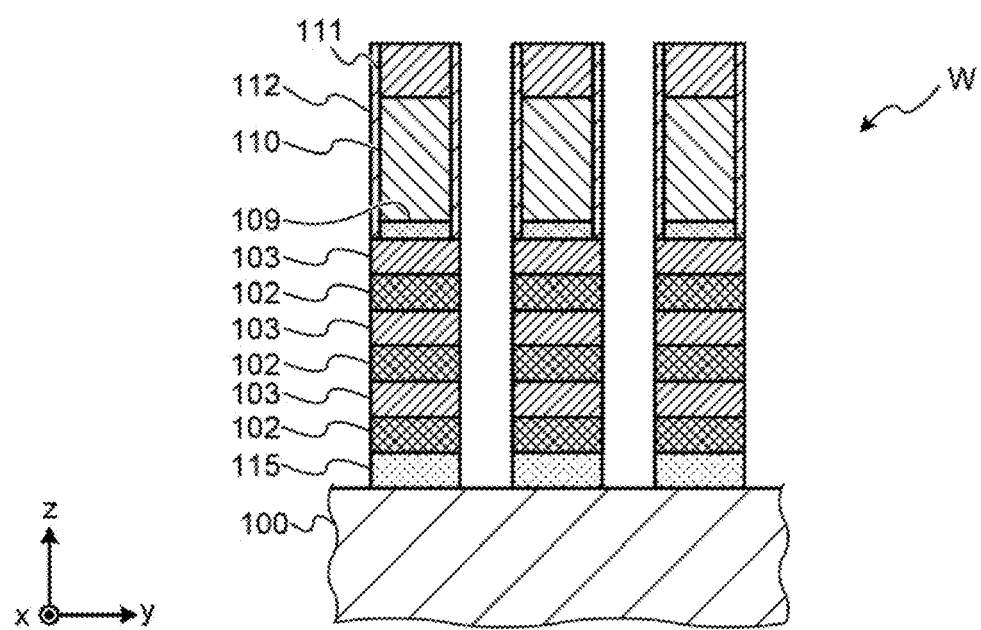
FIG. 36 illustrates an exemplary step of removing a part of the dielectric film in the nano-sheet device manufacturing procedure according to the third embodiment of the present disclosure.

FIG. 35 illustrates an exemplary step of depositing a dielectric film in the nano-sheet device manufacturing procedure according to the third embodiment of the present disclosure. As illustrated in FIG. 36, a dielectric film 115 is conformally deposited upon substrate W. The dielectric film 115 may be conformally deposited by ALD, CVD, or another deposition process. It is noted that dielectric film 115 is deposited onto mask 111, which is not removed prior to deposition of dielectric film 112. By conformally depositing dielectric film 115, each space 120 is filled with dielectric film 115. The dielectric film 115 may include, but is not limited to, a SiN film, a SiOC film, and a SiOCN film.

FIG. 36 illustrates an exemplary step of removing a part of the dielectric film in the nano-sheet device manufacturing procedure according to the third embodiment of the present disclosure. As illustrated in FIG. 36, isotropic etching is performed to remove portions of the dielectric film 115 upon substrate W except for the dielectric film 115 in positions that were previously filled spaces 120. The isotropic etching is performed to remove the dielectric film on a top surface of mask 111, on Si substrate 100, and on side surfaces of dielectric film 112, Si-containing films 103 and first sacrificial films 102. After the isotropic etching, dielectric film 115 remains in the position that were previously spaces 120. In an exemplary implementation, portions of the dielectric film 115 are removed by isotropic etching. However, other processes such as anisotropic etching, wet etching or gas etching, may be performed to remove the portions of the dielectric film 115.

Figure 37:
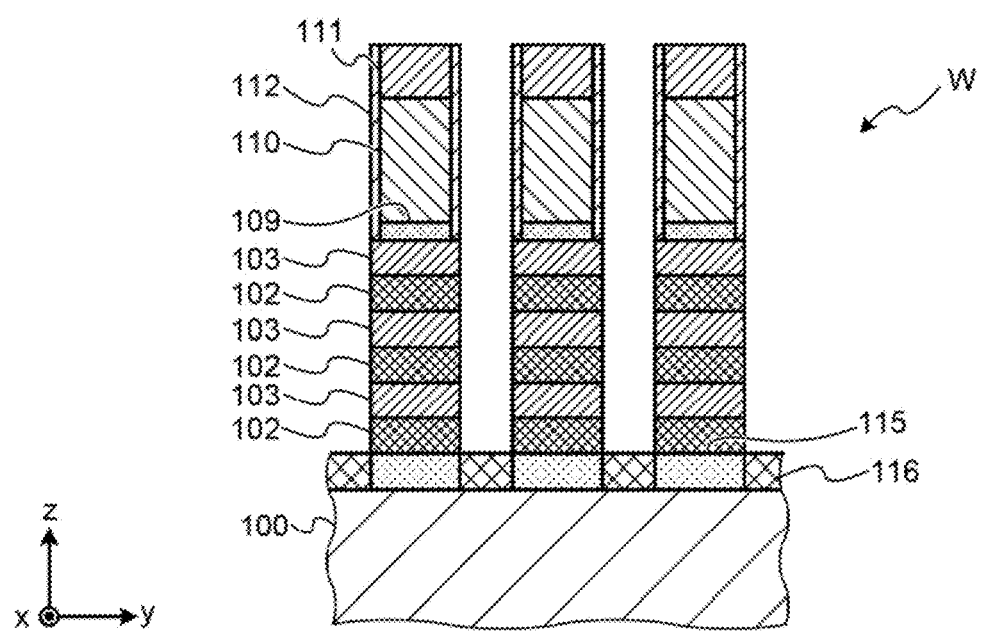
FIG. 37 illustrates an exemplary step of depositing a dielectric film in the nano-sheet device manufacturing procedure according to the third embodiment of the present disclosure.

FIG. 37 illustrates an exemplary step of depositing a dielectric film in the nano-sheet device manufacturing procedure according to the third embodiment of the present disclosure. As illustrated in FIG. 37, dielectric film 116 is deposited on the bottom of each trench between the gates and upon a top surface of Si substrate 100. The deposited dielectric film 116 is adjacent to dielectric film 115 that remained after the etching in FIG. 36. In an exemplary implementation, dielectric film 116 is deposited by anisotropic deposition. However, other deposition processes such as isotropic deposition may be performed. The dielectric film 116 may include, but is not limited to, a SiN film, a SiOC film, and a SiOCN film.

After deposition of dielectric film 116 onto substrate W, the third embodiment of the nano-sheet device manufacturing procedure may continue with performance of the processing steps illustrated in FIGS. 22-24.

Referring back to FIGS. 1 and 2, due to the high-Ge-content in the second sacrificial film 101, cracks in a crystal are more likely to be caused by annealing in the second sacrificial film 101 than in other films. Such cracks in the crystal of the second sacrificial film 101 may lead to crack propagation to the first sacrificial films 102 and the Si-containing films 103.

The nano-sheet device manufacturing procedures in accordance with the present disclosure solve these problems. In particular, the nano-sheet device manufacturing procedures illustrated in FIGS. 25-30 as well as FIGS. 31-37 remove a second sacrificial film after formation of a gate structure. As a result, the first sacrificial films 102 and the Si-containing films 103 are supported by the Si-containing film 110 and the dielectric film 109. Such a structural configuration prevents pattern collapse. Therefore, the resulting nano-sheet device will have less defects.

Figure 38:
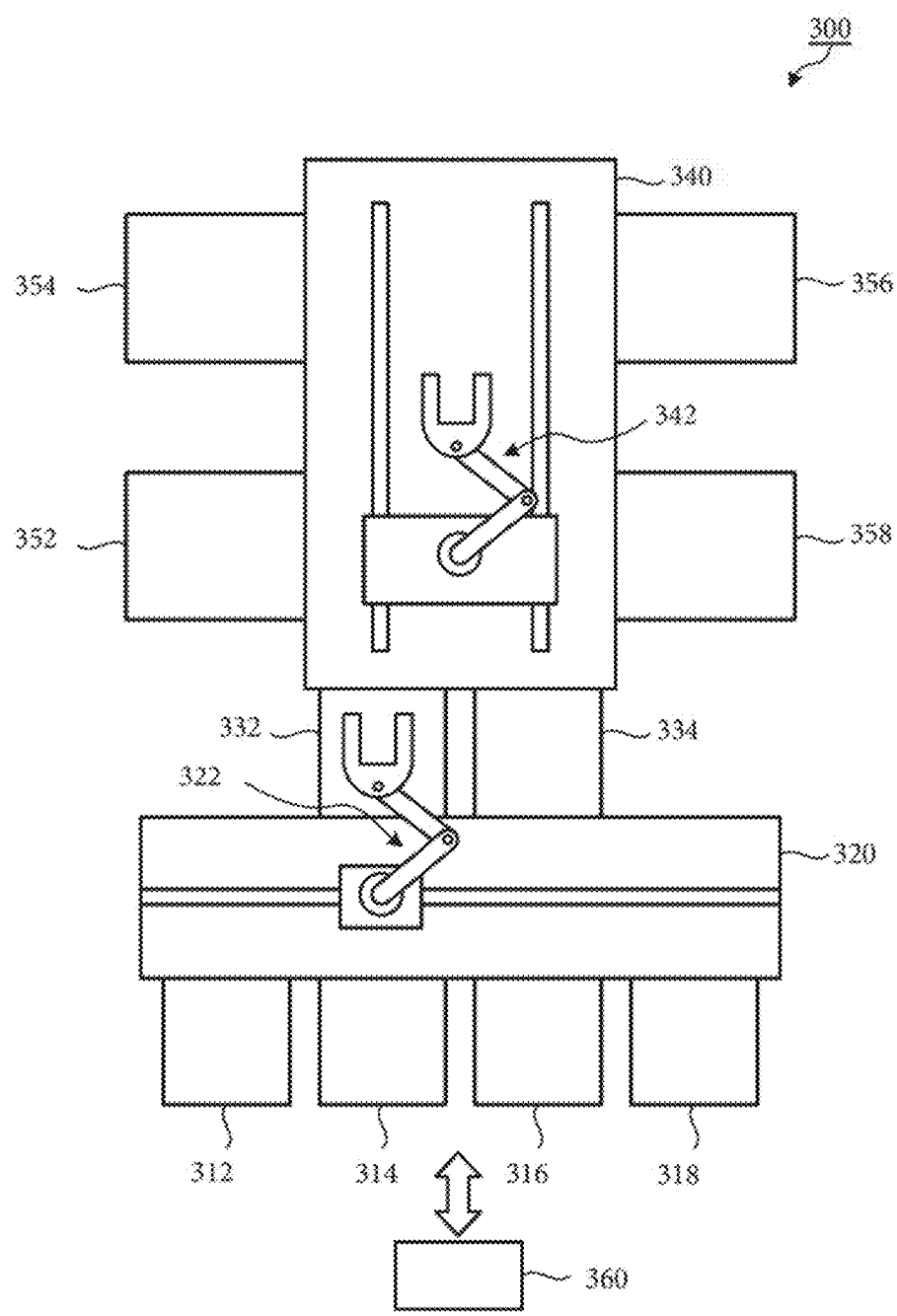
FIG. 38 illustrates an exemplary substrate processing system according to the present disclosure.

Next, discussion will proceed to FIG. 38, which illustrates a substrate processing system 300 according to the present disclosure. Substrate processing system 300 includes transfer device 340 (that operates at a reduced pressure with respect to etching apparatuses 352, 354, 356, and 358) that includes a transfer robot 342 to transport a substrate W, to and from etching apparatuses 352, 354, 356, and 358. The transfer device 340 has a vacuum transportation chamber that interfaces with load lock chambers 332 and 334. The etching apparatuses 352, 354, 356 and 358 are connected to the transport device 340 and partitioned from load lock chambers 332 and 334.

Load lock chambers 332 and 334 provide a way to compartmentalize environments between the transfer device 340 and the loader device 320. The loader device 320 has a carrier placing table in which a carrier is placed. The carrier holds, for example, twenty five substrates W and when moved in and out of the substrate processing system 300 is placed on a front surface of the loader device 320. The loader robot 322 transports substrates between the carrier placing table and the load lock chambers 332 and 334. Carriers are exchanged in respective load ports 312-318.

Figure 40:
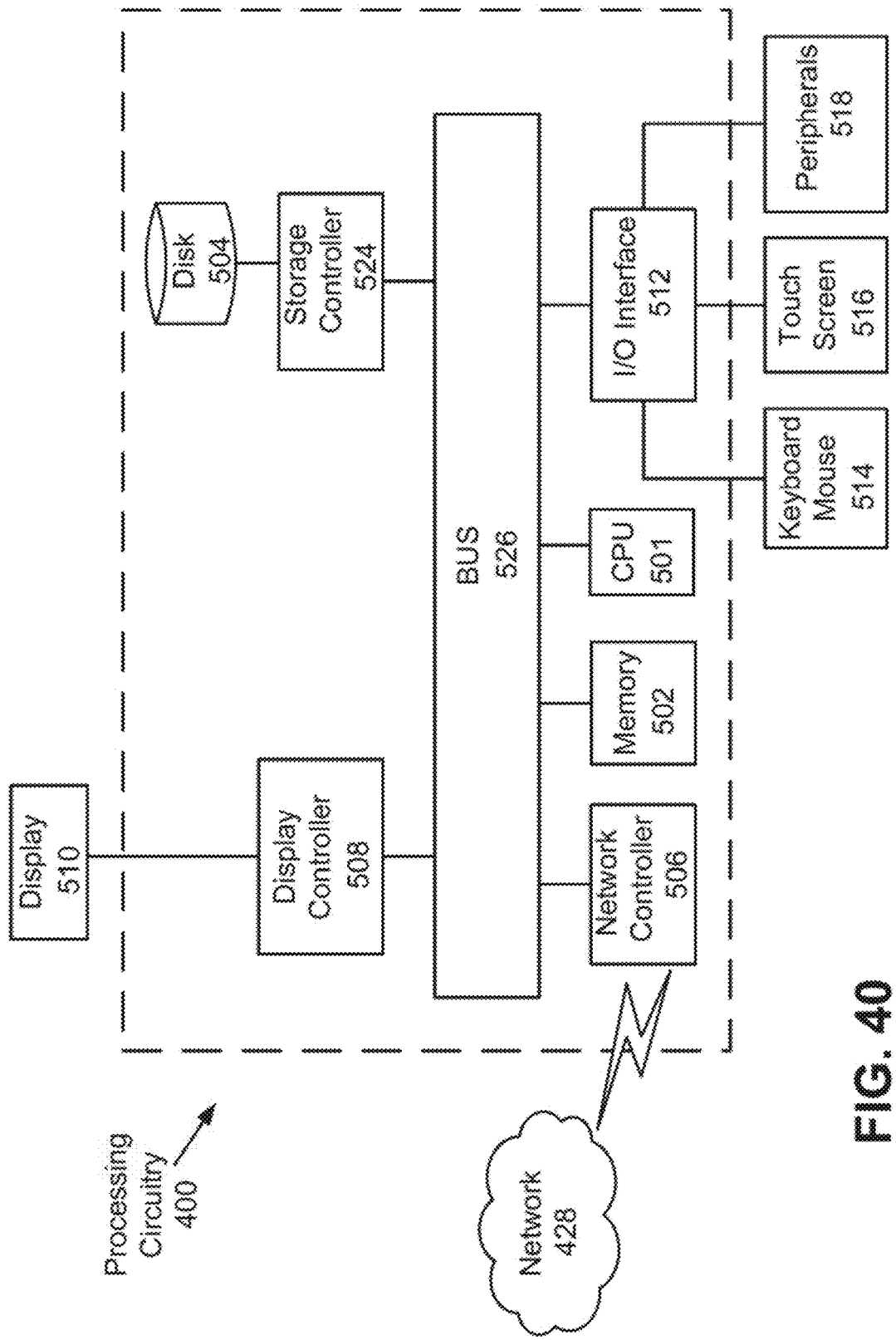
FIG. 40 illustrates exemplary processing circuitry that performs computer-based operations in accordance with the present disclosure.

A controller 360, in this example is a microcontroller, although a computer (local dedicated computer, or distributed computer) and/or processing circuitry such as that described in FIG. 40 may be used as an alternative of controller circuitry that is configured by computer code to perform control operations described herein.

Figure 39:
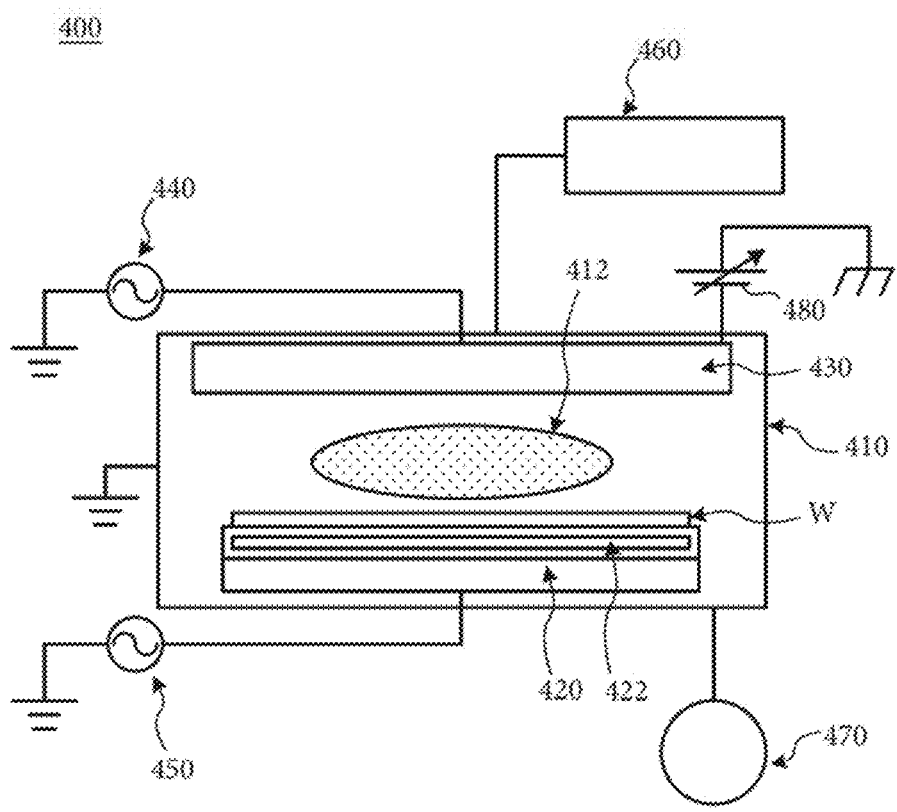
FIG. 39 illustrates an etching apparatus of the exemplary substrate processing system.

FIG. 39 schematically illustrates a etching apparatus 400, e.g., a capacitively coupled plasma (CCP) plasma system, that couples to the transfer device via a gate valve. While a CCP system is shown as an example, any other etching apparatus may also be used, such as inductively coupled plasma (ICP) apparatus and the like. The etching apparatus 400 includes a reaction chamber 410, which is approximately cylindrical in shape and formed of, for example, aluminum. The reaction chamber 410 is connected to ground potential. A film having plasma resistance is formed on the inner wall surface of the reaction chamber 410, and may be a film formed by an anodic oxidation treatment or a ceramic film, such as a film formed of yttrium oxide. When RF power is supplied to at least one of the upper electrode 430 and base 420 (serving as a lower electrode for generating plasma in the reaction chamber 410), a plasma 412 is developed between the upper electrode 430 and the base 420, with a substrate W to be processed therebetween. The plasma 412 is formed proximate to the substrate W, and the substrate W is held on an upper surface of an electrostatic chuck 422 as will be discussed in more detail below. The base 420 has an approximately disc shape and is conductive.

A gas source 460 includes a plurality of gas sources that are controlled via a corresponding series of flow rate controllers. The gas source 460 provides the gases via one or more gas lines to the reaction chamber 410.

The etching apparatus 400 further includes a first RF power supply 440 that generates RF energy in an inclusive range of 27 MHz through 100 MHz, with 60 MHz being an exemplary frequency. The first RF power supply 440 is connected to the upper electrode 430 through a matching circuit that matches an output impedance of the first RF power supply 440 and an impedance of the upper electrode 430.

The etching apparatus 400 further includes a second RF power supply 450 that generates RF energy for bias purposes so as to attract ions to the substrate W. An operational frequency of the second RF power supply 450 is lower than that for the first RF power supply 440, typically in a range of 400 kHz to 13.56 MHz. In an alternate embodiment, multiple RF power supplies 440 and 450 may be coupled to the same electrode (lower electrode 420).

The upper electrode 430 has a second power supply, which is a variable direct current (DC) power supply 480. The variable DC power supply 480 may also serve as a DC bias for the RF energy applied to the upper electrode from the first RF power supply 440. The variability of the DC power supply 480 allows for operational control over ion energy such that etch rates are controllable depending on the process being performed.

The RF energy generated by RF power supply 450 may be pulsed. When bias electric power is supplied to the base/lower electrode, etching mainly occurs. When bias electric power is not supplied to the base/lower electrode, deposition mainly occurs. A pulsed bias allows to separate the etch phase from the deposition phase. Etching occurs after a protective film is formed, and the sidewall of the recess is protected from side etch. Additionally, a change of duty of the pulse (bias on time/(bias on time+bias off time)) can control an etch/deposition balance. A longer bias off time can form protective film thicker, which leads to more protection. A longer bias on time increases an etch rate.

In an embodiment, the etching apparatus 400 may have dedicated control circuitry (e.g., processing circuitry such as that in FIG. 40) that operates exclusive of in or collaboration with the controller 360 (FIG. 38). The controller 360 executes a control program stored in memory, and controls each component of the etching apparatus 400 based on recipe data stored in the storage device.

The etching apparatus 400 includes an exhaust device 470 that is connected to an internal atmosphere of the reaction chamber 410. The exhaust device 470 includes a pressure controller, such as an automatic pressure control valve, a vacuum pump (e.g., turbo molecular pump), so as to controllably depressurize the reaction chamber 410 and exhaust gases from the reaction chamber 410.

In an exemplary implementation, substrate processing system 300 and etching apparatus 400 perform the nano-sheet device manufacturing procedure steps illustrated and described with respect to FIGS. 3-37. However, other devices or components may be utilized to perform the nano-sheet manufacturing procedure steps illustrated and described above with respect to FIGS. 3-37.

FIG. 40 is a block diagram of processing circuitry for performing computer-based operations described herein. FIG. 40 illustrates processing circuitry 500 that may be used to control any computer-based and cloud-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 40, the processing circuitry 500 includes a CPU 501 which performs one or more of the control processes described above/below. The process data and instructions may be stored in memory 502. These processes and instructions may also be stored on a storage medium disk 504 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 500 communicates, such as a server or computer. The processes may also be stored in network based storage, cloud-based storage or other remote accessible storage and executable by processing circuitry 500.

Further, the claimed advancements may be provided as a utility application, background daemon, or component of an operating system, or combination thereof, executing in conjunction with CPU 501 and an operating system such as Microsoft Windows, UNIX, Solaris, LINUX, Apple MAC-OS and other systems known to those skilled in the art.

The hardware elements in order to achieve the processing circuitry 500 may be realized by various circuitry elements. Further, each of the functions of the above described embodiments may be implemented by circuitry, which includes one or more processing circuits. A processing circuit includes a particularly programmed processor, for example, processor (CPU) 501, as shown in FIG. 40. A processing circuit also includes devices such as an application specific integrated circuit (ASIC) and conventional circuit components arranged to perform the recited functions.

In FIG. 40, the processing circuitry 500 includes a CPU 501 which performs the processes described above. The processing circuitry 500 may be a general-purpose computer or a particular, special-purpose machine. In one embodiment, the processing circuitry 500 becomes a particular, special-purpose machine when the processor 501 is programmed to perform ESC in-situ replacement by controlling voltages and robot arms to replace the ESC without exposing the reaction chamber 410 to an external atmosphere. The processing circuitry 500 may be in or locally communicable to substrate processing apparatus 300. In some embodiments, processing circuitry 500 may be remote from substrate processing apparatus 300, providing processing instructions to substrate processing apparatus 300 via network 528.

Alternatively, or additionally, the CPU 501 may be implemented on an FPGA, ASIC, PLD or using discrete logic circuits, as one of ordinary skill in the art would recognize. Further, CPU 501 may be implemented as multiple processors cooperatively working in parallel to perform the instructions of the inventive processes described above.

The processing circuitry 500 in FIG. 40 also includes a network controller 506, such as an Intel Ethernet PRO network interface card from Intel Corporation of America, for interfacing with network 528. As can be appreciated, the network 528 can be a public network, such as the Internet, or a private network such as an LAN or WAN network, or any combination thereof and can also include PSTN or ISDN sub-networks. The network 528 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 500 further includes a display controller 508, such as a graphics card or graphics adaptor for interfacing with display 510, such as a monitor. A general purpose I/O interface 512 interfaces with a keyboard and/or mouse 514 as well as a touch screen panel 516 on or separate from display 510. General purpose I/O interface also connects to a variety of peripherals 518 including printers and scanners.

The general-purpose storage controller 524 connects the storage medium disk 504 with communication bus 526, which may be an ISA, EISA, VESA, PCI, or similar, for interconnecting all of the components of the processing circuitry 500. A description of the general features and functionality of the display 510, keyboard and/or mouse 514, as well as the display controller 508, storage controller 524, network controller 506, and general purpose I/O interface 512 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

ELEMENT REFERENCE NUMERALS

R Region
W, W', W" Substrate
100, 200 Silicon substrate
101 Second sacrificial film
102 First sacrificial film
103, 110 Si-containing film 104 Hard mask
105, 121 Trench
106, 108, 109, 112, 113, 115, 116, 126 Dielectric film
107, 111 Mask
120 Space
201, 202 Source/drain electrode
203, 207 Gate electrode
204 Gate dielectric film
205 Spacer film
206 Nano-sheet channel
210 SOI substrate
211 Silicon layer
212 Dielectric layer
300 Substrate processing apparatus
312, 314, 316, 318 Load ports
320 Loader
322 Loader robot
332, 334 Load lock chamber
340 Transfer device
342 Transfer robot
352, 354, 356, 400 Etching system
358 Stocker/changer
360 Controller
410 Reaction chamber
412 Base
420, 430 Upper electrode
422 Electrostatic chuck
440, 450 RF power supply
460 Gas source
470 Exhaust device
480 DC power supply
500 Processing circuitry
501 CPU
502 Memory
504 Disk
506 Network controller
508 Display controller
510 Display
512 I/O interface
514 Keyboard/Mouse
516 Touch screen
518 Peripherals
524 Storage controller
526 Communication Bus
528 Network

What is claimed is:

1. A method for manufacturing a semiconductor device, the method comprising:
forming a support on a side surface of a stack that extends from a substrate, the stack including a second sacrificial film, plural first sacrificial films and plural silicon (Si)-containing films, wherein one first sacrificial film of the plural first sacrificial films is stacked upon the second sacrificial film and the plural first sacrificial films and the plural Si-containing films are alternately stacked upon one another, and at least a side of the second sacrificial film is not covered by the support, the one first sacrificial film and the substrate;
removing the second sacrificial film from the stack to form a space between the substrate and the one first sacrificial film and adjacent to the support; and
filling the space with a dielectric film.

2. The method according to claim 1, wherein the removing the second sacrificial film is performed while supporting the stack with the support and keeping the stack in contact with the side surface of the stack.

3. The method according to claim 1, wherein
the second sacrificial film includes Si and germanium (Ge),
each of the plural first sacrificial films includes Si and Ge, and
a first concentration of Ge in the plural first sacrificial films is different than a second concentration of Ge in the second sacrificial film.

4. The method according to claim 3, wherein the second concentration is higher than the first concentration.

5. The method according to claim 1, wherein the Si-containing films include single crystalline Si.

6. The method according to claim 1, wherein a thickness of the support is larger than or equal to 5 nm and smaller than or equal to 10 nm.

7. A method for manufacturing a semiconductor device, the method comprising:
forming a support, that is in contact with a substrate, on a side surface of a stack that extends from the substrate, the stack including a second sacrificial film, plural first sacrificial films and plural silicon (Si)-containing films, wherein one first sacrificial film of the plural first sacrificial films is stacked upon the second sacrificial film and the plural first sacrificial films and the plural Si-containing films are alternately stacked upon one another, and at least a side of the second sacrificial film is not covered by the support, the one first sacrificial film and the substrate;
removing the second sacrificial film from the stack to form a space between the substrate and the one first sacrificial film and adjacent to the support;
filling the space with a dielectric film;
removing the support after the filling; and
forming a gate structure after removal of the support.

8. The method according to claim 7, further comprising:
after forming the support and before removing the second sacrificial film, forming a mask to expose one surface of the stack from the mask.

9. The method according to claim 7, further comprising:
after forming the support and before removing the second sacrificial film, forming a mask by oblique deposition by sputtering.

10. The method according to claim 7, wherein a thickness of the support is larger than or equal to 5 nm and smaller than or equal to 10 nm.

11. The method according to claim 7, wherein
the second sacrificial film includes Si and germanium (Ge),
each of the plural first sacrificial films includes Si and Ge, and
a first concentration of Ge in the plural first sacrificial films is different than a second concentration of Ge in the second sacrificial film.

12. The method according to claim 11, wherein the second concentration is higher than the first concentration.

13. The method according to claim 7, wherein the Si-containing films include single crystalline Si.

14. The method according to claim 7, wherein the removing second sacrificial film is performed while the support is in contact with the side surface of the stack.

15. A method for manufacturing a semiconductor device, the method comprising:
forming a gate structure that covers a stack that extends from a substrate, the stack including a second sacrificial film, plural first sacrificial films and plural silicon (Si)-containing films, wherein one first sacrificial film of the plural first sacrificial films is stacked upon the second sacrificial film and the plural first sacrificial films and the plural Si-containing films are alternately stacked upon one another;

removing the second sacrificial film, after forming the gate structure, from the stack to form a space between the substrate and the one first sacrificial film while an upper surface of the stack is not covered by the gate structure;

etching, after removing the second sacrificial film, the stack using the gate structure as a mask; and filling the space with a dielectric film.

16. The method according to claim 15, wherein the second sacrificial film includes Si and germanium (Ge), each of the plural first sacrificial films includes Si and Ge, and a first concentration of Ge in the plural first sacrificial films is different than a second concentration of Ge in the second sacrificial film.

17. The method according to claim 16, wherein the second concentration is higher than the first concentration.

18. The method according to claim 15, wherein the Si-containing films include single crystalline Si.

* * * * *